United States Patent
Wang et al.

(10) Patent No.: US 11,039,052 B2
(45) Date of Patent: Jun. 15, 2021

(54) CAMERA MODULE AND MOLDING CIRCUIT BOARD ASSEMBLY, CIRCUIT BOARD AND APPLICATION THEREOF

(71) Applicant: Ningbo Sunny Opotech Co., Ltd., Zhejiang (CN)

(72) Inventors: Mingzhu Wang, Zhejiang (CN); Duanliang Cheng, Zhejiang (CN); Fengsheng Xi, Zhejiang (CN); Bojie Zhao, Zhejiang (CN); Takehiko Tanaka, Nara (JP); Zhen Huang, Zhejiang (CN); Zhenyu Chen, Zhejiang (CN); Nan Guo, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 0 days.

(21) Appl. No.: 16/483,150

(22) PCT Filed: Feb. 5, 2018

(86) PCT No.: PCT/CN2018/075334
§ 371 (c)(1),
(2) Date: Aug. 2, 2019

(87) PCT Pub. No.: WO2018/141295
PCT Pub. Date: Aug. 9, 2018

(65) Prior Publication Data
US 2020/0244852 A1     Jul. 30, 2020

(30) Foreign Application Priority Data
Feb. 4, 2017   (CN) .......................... 201710064137.7

(51) Int. Cl.
*H04N 5/225*    (2006.01)
*H05K 1/18*     (2006.01)
*H05K 3/30*     (2006.01)

(52) U.S. Cl.
CPC ......... *H04N 5/2257* (2013.01); *H04N 5/2254* (2013.01); *H05K 1/181* (2013.01);
(Continued)

(58) Field of Classification Search
CPC .... H04N 5/2257; H04N 5/2254; H05K 1/181; H05K 3/303; H05K 2201/10121;
(Continued)

(56) References Cited

U.S. PATENT DOCUMENTS 5,991,468 A * 11/1999 Murakami ............ G06F 1/1632
                                                        348/E5.025
2006/0145325 A1* 7/2006 Yang ................. H01L 27/14618
                                                            257/680
(Continued)

FOREIGN PATENT DOCUMENTS

CN         1697189      11/2005
CN       102572320       7/2012
(Continued)

OTHER PUBLICATIONS

International Search Report dated Apr. 13, 2018 in International Application No. PCT/CN2018/075334.
(Continued)

*Primary Examiner* — Ahmed A Berhan
(74) *Attorney, Agent, or Firm* — Wenderoth, Lind & Ponack, L.L.P.

(57) ABSTRACT

The present invention provides a camera module and a molding circuit board assembly, circuit board and application thereof, the circuit board comprising a digital circuit unit, an analog circuit unit and a substrate. The digital circuit nit and the analog circuit unit are respectively formed on the substrate, and the digital circuit unit and the analog circuit unit are conductively connected to each other, wherein at least one part of the analog circuit unit has a safe distance
(Continued)

from the digital circuit unit, so as to prevent an electromagnetic wave generated by a circuit of the digital circuit unit from interfering with an electrical signal transmitted and processed by the analog circuit unit, thereby improving the stability and reliability of the transmission and the processing of the electrical signal by the circuit board.

19 Claims, 19 Drawing Sheets

(52) U.S. Cl.
CPC ... H05K 3/303 (2013.01); *H05K 2201/10121* (2013.01); *H05K 2201/10151* (2013.01); *H05K 2201/10424* (2013.01)

(58) Field of Classification Search
CPC .......... H05K 2201/10151; H05K 2201/10424; H05K 2203/1322; H05K 1/0216; H05K 1/0274; H05K 2201/09972; H05K 5/2253
See application file for complete search history.

(56) References Cited

U.S. PATENT DOCUMENTS

| | | |
|---|---|---|
| 2006/0221585 A1 | 10/2006 | Brench |
| 2007/0182613 A1 | 8/2007 | Deguchi |
| 2008/0165620 A1 | 7/2008 | Sugiura |
| 2010/0132984 A1 | 6/2010 | Narazako et al. |
| 2013/0187031 A1 | 7/2013 | Popp et al. |
| 2015/0123514 A1 | 5/2015 | Ishikawa et al. |
| 2016/0157338 A1 | 6/2016 | Toyota et al. |
| 2016/0190353 A1 | 6/2016 | Liao et al. |
| 2016/0227643 A1 | 8/2016 | Toyota et al. |
| 2017/0280027 A1 | 9/2017 | Wang et al. |
| 2020/0244852 A1 | 7/2020 | Wang et al. |

FOREIGN PATENT DOCUMENTS

| | | |
|---|---|---|
| CN | 104126131 | 10/2014 |
| CN | 104639090 | 5/2015 |
| CN | 105657957 | 6/2016 |
| CN | 105681640 | 6/2016 |
| CN | 105742304 | 7/2016 |
| CN | 105848406 | 8/2016 |
| CN | 209089073 | 7/2019 |
| CN | 209105276 | 7/2019 |
| EP | 3 579 537 | 12/2019 |
| JP | 8-115998 | 5/1996 |
| JP | 9-186456 | 7/1997 |
| JP | 2004-297449 | 10/2004 |
| JP | 2008-010859 | 1/2008 |
| JP | 2011-134777 | 7/2011 |
| JP | 2013-201568 | 10/2013 |
| KR | 10-2015-0033088 | 4/2015 |

OTHER PUBLICATIONS

Extended European Search Report dated Oct. 1, 2020 in European Patent Application No. 18748678.2.

* cited by examiner

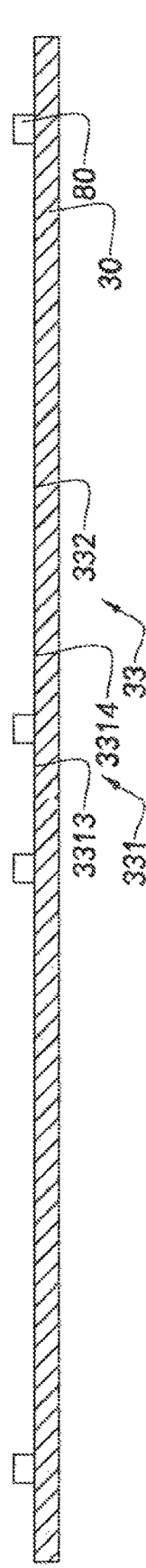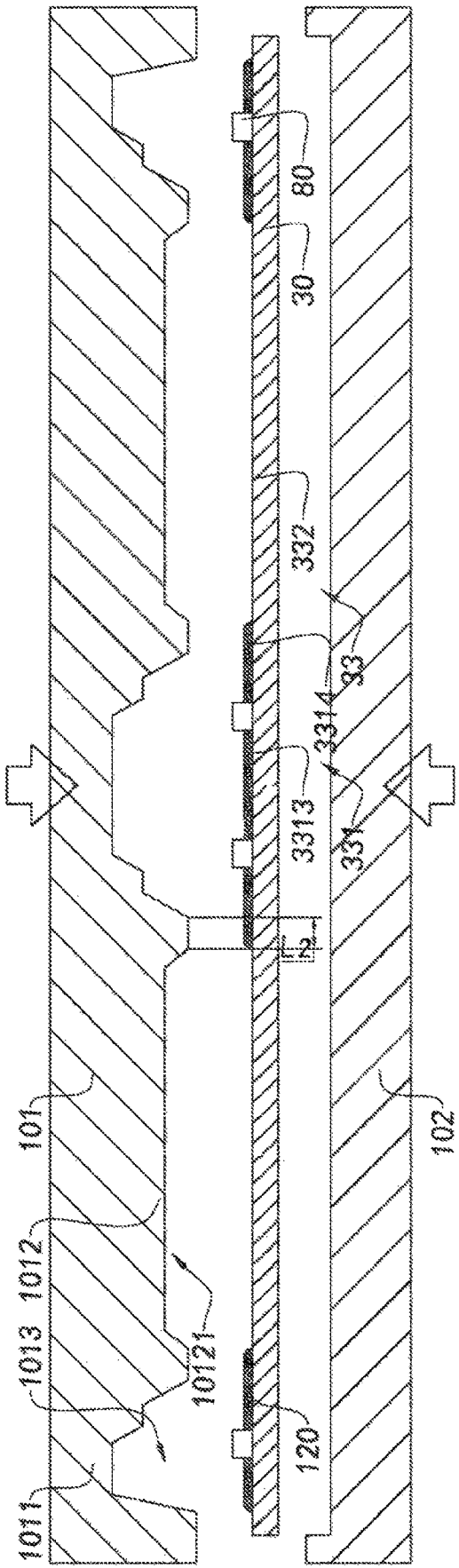

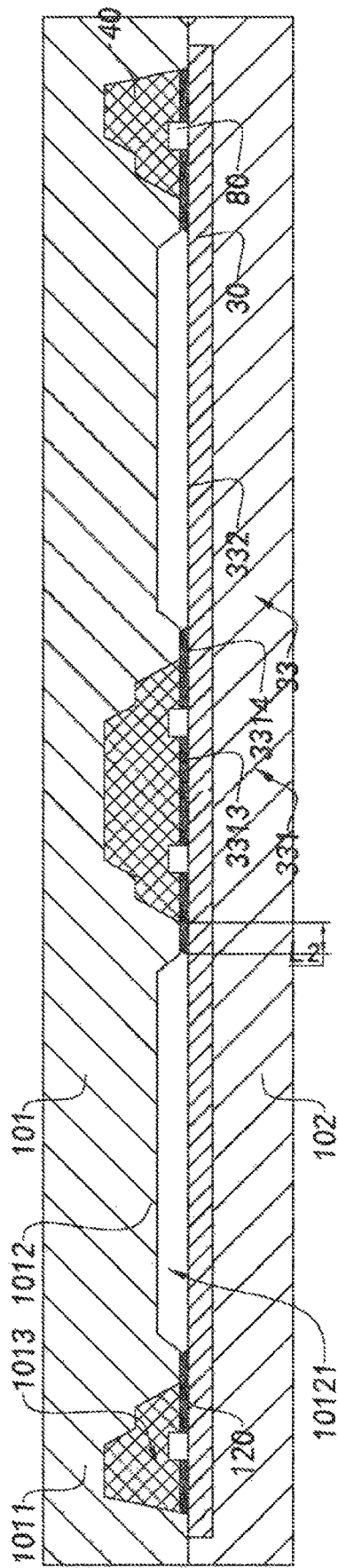
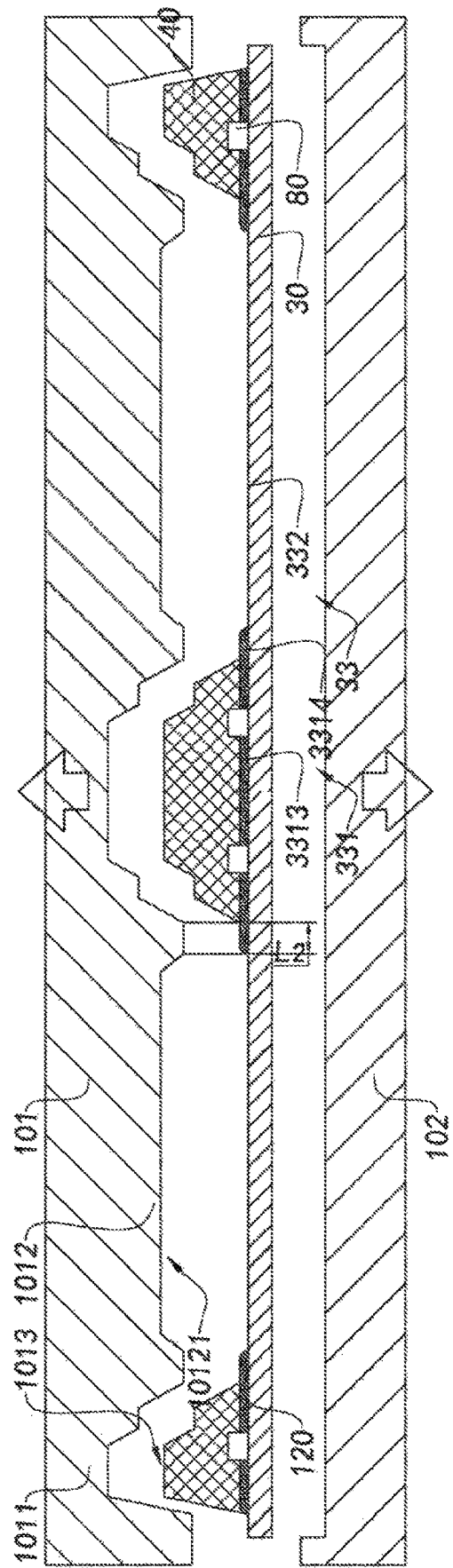
Fig.15
Fig.16

CAMERA MODULE AND MOLDING CIRCUIT BOARD ASSEMBLY, CIRCUIT BOARD AND APPLICATION THEREOF

FIELD OF THE INVENTION

The present invention relates to the field of optical imaging, and more particularly to a camera module, a molding circuit board assembly, a circuit board and application thereof.

BACKGROUND OF THE INVENTION

The rapid development of technology has made electronic devices more and more oriented towards high-performance and intelligent development. The degree of intelligence of electronic devices depends on the camera module that is conFig.d in the electronic device, wherein, especially the imaging quality and signal transmission capability of the camera module have a great influence on the intelligence of the electronic device. In addition, the size of the camera module (including the circumferential size and height) affects the lightness and thinness of the electronic device. Therefore, improving the imaging quality and signal transmission capability of the camera module based on reducing the size of the camera module has become an urgent technical problem in the field.

FIG. 1 shows a circuit board 10P of a conventional camera module, wherein a digital circuit unit 11P and an analog circuit unit 12P are disposed in the circuit board 10P, the digital circuit unit 11P and the analog circuit unit 12P are conductively communicated with each other, wherein the circuit of the digital circuit unit 11P and the circuit of the analog circuit unit 12P are disposed in a mixed manner, and at least one photosensitive chip is conductively connected to the digital circuit unit 11P. The digital circuit unit 11P is for processing a digital signal, wherein the digital signal includes MIPI (digital transmission type data signal), IIC (digital control type signal), MCLK (digital clock signal), DVDD/DGND (digital power supply), and the like, the analog circuit unit 12P is for processing an analog signal, wherein the analog signal includes AVDD (analog power supply), VTG/VRGSL (analog voltage reference), and the like. It will be known by those skilled in the art that the digital circuit unit 11P processes and transmits the digital signal in such a communication manner that high and low peak signals of current are communicated, and the circuit of the digital circuit unit 11P will generates electromagnetic waves near the circuit as transmitting the digital signal, the analog circuit unit 12P processes and transmits the analog signal in such a communication manner that current and voltage are slightly fluctuating, such that the analog circuit unit 12P is susceptible to interference of electromagnetic wave as transmitting the analog signal. The circuit board 10P of the conventional camera module is disposed in such a manner that the circuits of the digital circuit unit 11P and the circuits of the analog circuit unit 12P are mixed together, causing the analog circuit unit 12 to be susceptible to interference of electromagnetic waves generated by the circuit of the digital circuit part 11P to reduce the ability of transmitting and processing signal of the circuit board 10P as processing and transmitting the analog signal, thereby affecting the performance of the camera module. In addition, the circuit part 10P of the conventional camera module is dispose in such a manner that the circuit of the digital circuit unit 11P and the circuit of the analog circuit unit 12P are mixed together, thereby not only increasing the complexity of the circuit of the circuit board 10P, but also reducing the reliability of the circuit board 10P. Therefore, preventing the electromagnetic wave generated by the circuit of the digital circuit unit 11P from interfering with the analog signal processed and transmitted by the analog circuit unit 12P, and overcoming various problems arising in the process becomes a problem to be solved by the present invention. In addition, reducing the size of the camera module and overcoming various problems arising in the process is also a problem to be solved by the present invention.

SUMMARY OF THE INVENTION

The object of the present invention is to provide a camera module, a molding circuit board assembly, a circuit board and application thereof, wherein stability of the circuit board as transmitting an electrical signal is effectively enhanced.

The object of the present invention is to provide a camera module, a molding circuit board assembly, a circuit board and application thereof, wherein stability of the circuit board as processing the electrical signals is effectively enhanced.

The object of the present invention is to provide a camera module, a molding circuit board assembly, a circuit board and application thereof, wherein the circuit board includes a digital circuit unit and an analog circuit unit, the digital circuit unit and the analog circuit unit are conductively communicated, and electromagnetic waves generated by the circuit of the digital circuit unit are prevented from interfering with the electrical signal processed and transmitted by the analog circuit unit.

The object of the present invention is to provide a camera module, a molding circuit board assembly, a circuit board and application thereof, wherein at least one part of the analog circuit unit has a safe distance from the digital circuit unit to prevent electromagnetic waves generated by the circuits of the digital circuit unit from interfering with the electrical signals processed and transmitted by the analog circuit unit.

The object of the present invention is to provide a camera module, a molding circuit board assembly, a circuit board and application thereof, wherein the circuit board includes a substrate, and the digital circuit unit and the analog circuit unit can be respectively formed on the different areas of the substrate to be able to form the safe distance between the analog circuit unit and the digital circuit unit.

The object of the present invention is to provide a camera module, a molding circuit board assembly, a circuit board and application thereof, wherein the substrate has at least one digital circuit area and an analog circuit area, the digital circuit unit is formed of a circuit disposed in the digital circuit area and an electronic component located in the digital circuit area, the analog circuit unit is formed of a circuit disposed in the analog circuit area and an electronic component located in the analog circuit area, thereby the circuit of the digital circuit unit and at least one part of the circuit of the analog circuit unit are no longer mixed together, thereby preventing electromagnetic waves generated by the circuit of the digital circuit unit from interfering with the electrical signals processed and transmitted by the analog circuit unit.

The object of the present invention is to provide a camera module, a molding circuit board assembly, a circuit board and application thereof, wherein the substrate has at least one chip holding portion for holding at least one photosensitive chip, wherein the photoreceptor chip of the chip holding portion of the substrate and the digital circuit unit are conductively connected to the analog circuit unit.

The object of the present invention is to provide a camera module, a molding circuit board assembly, a circuit board and application thereof, wherein the analog circuit unit surrounds at least two sides of the chip holding portion of the substrate.

The object of the present invention is to provide a camera module, a molding circuit board assembly, a circuit board and application thereof, wherein the size of the camera module can be reduced, such that the camera module is particularly suitable for use in electronic device that is light and thin.

The object of the present invention is to provide a camera module, a molding circuit board assembly, a circuit board and application thereof, wherein the substrate has at least one accommodating space to form the chip holding portion, wherein the photosensitive chip is accommodated in the accommodation space to sink the photosensitive chip, and in this way, the height of the camera module can be reduced.

The object of the present invention is to provide a camera module, a molding circuit board assembly, a circuit board and application thereof, wherein the photosensitive chip is accommodated in the accommodating space to sink the photosensitive chip, and in this way, the height difference between the upper surface of the photosensitive chip and the upper surface of the substrate can be reduced, even the upper surface of the photosensitive chip and the upper surface of the substrate have same height, or the upper surface of the photosensitive chip is lower than the upper surface of the substrate, such that the height of the camera module is reduced.

The object of the present invention is to provide a camera module, a molding circuit board assembly, a circuit board and application thereof, wherein at least one part of the circuit of the analog circuit unit extends along a width direction of the substrate, such that the circuit of the circuit board is more compact and reasonable.

The object of the present invention is to provide a camera module, a molding circuit board assembly, a circuit board and application thereof, wherein the camera module provides a molding base, and the molding base can be integrally bonded to the circuit board, and in this way, the size of the camera module can be reduced, such that the camera module is particularly suitable for use in the electronic device that are light and thin.

The object of the present invention is to provide a camera module, a molding circuit board assembly, a circuit board and application thereof, wherein the molding base can also be integrally bonded to a non-photosensitive area of the photosensitive chip, such that the photosensitive chip, the molding base, and the circuit board are integrally bonded.

The object of the present invention is to provide a camera module, a molding circuit board assembly, a circuit board and application thereof, wherein the molding base can reinforce the strength of the circuit board to make the circuit board flatter.

The object of the present invention is to provide a camera module, a molding circuit board assembly, a circuit board and application thereof, wherein the molding base can reinforce the strength of the circuit board, such that the circuit board can employ a thinner plate to reduce the height of the camera module.

The object of the present invention is to provide a camera module, a molding circuit board assembly, a circuit board and application thereof, wherein the molding base is capable of isolating electronic components attached to or partially embedded in the circuit board and the photosensitive chip to prevent contaminant departing from the surface of the electronic component or the connection position of the electronic component and the circuit board, such as debris, and the like, from contaminating the photosensitive chip.

The object of the present invention is to provide a camera module, a molding circuit board assembly, a circuit board and application thereof, wherein the molding base separates the analog circuit unit and the digital circuit unit to prevent electromagnetic waves generated by the circuit of the digital circuit unit from interfering with the electrical signals processed and transmitted by the analog circuit unit.

The object of the present invention is to provide a camera module, a molding circuit board assembly, a circuit board and application thereof, wherein the camera module further provides a protecting portion, wherein the protecting portion is located between the circuit board and an upper die of a molding die to protect the circuit board before the molding base is molded.

The object of the present invention is to provide a camera module, a molding circuit board assembly, a circuit board and application thereof, wherein the protecting portion is located between the circuit board and an upper die of the molding die, such that, when the upper die of the molding die contacts with the circuit board to generate an impact force, the protecting portion can absorb the impact force to prevent the impact force from directly acting on the circuit board, thereby preventing the circuit board from being damaged and deformed.

The object of the present invention is to provide a camera module, a molding circuit board assembly, a circuit board and application thereof, wherein the protecting portion is located between the circuit board and an upper die of the molding die to prevent a gap from being generated between the upper surface of the circuit board and the press-fitted surface of the upper die of the molding die, such that when the molding base is molded, it is possible to prevent a molding material from leaking into the chip holding portion of the substrate, thereby preventing the photosensitive chip from being contaminated. The object of the present invention is to provide a camera module, a molding circuit board assembly, a circuit board and application thereof, wherein the protecting portion is located between the circuit board and an upper die of the molding die to prevent a gap from being generated between the upper surface of the circuit board and the press-fitted surface of the upper die of the molding die, such that when the molding base is molded, it is possible to avoid the occurrence of "flash" caused by the leakage of the molding material.

The object of the present invention is to provide a camera module, a molding circuit board assembly, a circuit board and application thereof, wherein the protecting portion is disposed in a press-fitted surface of an upper die of the molding die, such that the protecting portion is held between the upper die of the molding die and the circuit board when the upper die of the molding die applies pressure to the upper surface of the circuit board.

The object of the present invention is to provide a camera module, a molding circuit board assembly, a circuit board and application thereof, wherein the protecting portion is disposed in an upper surface of the circuit board, such that the protecting portion is held between the upper die of the molding die and the circuit board when the upper die of the molding die applies pressure to the upper surface of the circuit board.

According to an aspect of the present invention, the present invention provides a circuit board, comprising:

a digital circuit unit;

an analog circuit unit; and a substrate, wherein the digital circuit unit and the analog circuit unit are respectively formed on the substrate, and the digital circuit unit and the analog circuit unit are conductively connected to each other, wherein at least one part of the analog circuit unit has a safe distance from the digital circuit unit.

According to an embodiment of the present invention, 40%~100% of part of the analog circuit unit has a safe distance from the digital circuit unit.

According to an embodiment of the present invention, 70%~99% of part of the analog circuit unit has a safe distance from the digital circuit unit.

According to an embodiment of the present invention, a parameter of a width of the safety distance formed between the analog circuit unit and the digital circuit unit is L1, wherein the parameter L1 of the width of the safety distance has a value range of: $0.02 \text{ mm} \leq L1 \leq 0.5 \text{ mm}$.

According to an embodiment of the present invention, wherein the parameter L1 of the width of the safety distance has a value range of: $0.1 \text{ mm} \leq L1 \leq 0.4 \text{ mm}$.

According to an embodiment of the present invention, the shape of the analog circuit unit is selected from the group consisting of an L shape, a C shape, and an unclosed O shape.

According to an embodiment of the present invention, the substrate has at least one accommodation space for accommodating a photosensitive chip.

According to an embodiment of the present invention, the substrate comprises two or more plate layers that overlap each other.

According to an embodiment of the present invention, the layer number of the plate layer of the substrate has a value range of: 2~20.

According to an embodiment of the present invention, the layer number of the plate layer of the substrate has a value range of: 4~10.

According to an embodiment of the present invention, the substrate has at least one communicating hole and includes at least one circuit connector, wherein each of the communicating holes of the substrate communicates with two adjacent plate layers, each of the circuit connectors is formed on an inner wall of the substrate, which is used to form the communicating hold, and each of the circuit connectors conductively connects the circuits of two adjacent plate layers.

According to an embodiment of the present invention, the circuit on each of the plate layers is respectively a horizontally extending circuit and a vertically extending circuit, the horizontally extending circuit extends along a length direction and/or a width direction of the plate layer, the vertically extending circuit extends along a vertical direction of the plate layer, wherein the vertically extending circuit of one of the plate layers are conductively connected with the horizontally extending circuit of adjacent plate layer by the circuit connector.

According to an embodiment of the present invention, the diameter parameter of the communicating hole is a, the width parameter of the circuit is b, the minimum distance parameter of adjacent circuits or adjacent communicating holes is c, the minimum distance parameter from the edge of the substrate to the edge of the analog circuit area is d, and the narrowest side width parameter of the substrate is e, wherein the parameter e has a value range of: $[2*d+\min(a, b)*2+c] \sim [2*d+10*\max(a, b)+9*c]$.

According to an embodiment of the present invention, the parameter e has a value range of: $[2*d+2*\max(a, b)+c] \sim [2*d+4*\max(a, b)+3*c]$.

According to an embodiment of the present invention, the thickness of the plate layer of the substrate has a value range of: 0.005 mm~0.5 mm.

According to an embodiment of the present invention, the thickness of the plate layer of the substrate has a value range of: 0.01 mm~0.2 mm.

According to an aspect of the present invention, the present invention further provides a molding circuit board assembly, comprising:

at least one photosensitive chip;

a molding base, wherein the molding base has at least one light window; and at least one circuit boards, wherein the circuit board comprises a digital circuit unit, an analog circuit unit and a substrate, wherein the digital circuit unit and the analog circuit unit are respectively formed on the substrate, and the digital circuit unit and the analog circuit unit are conductively connected to each other, wherein at least one part of the analog circuit unit has a safe distance from the digital circuit unit, wherein the photosensitive chip is held in a chip holding portion of the circuit board, and the photosensitive chip is conductively connected to at least one circuit portion of the analog circuit unit and the digital circuit unit of the circuit board, wherein the molding base is integrally bonded to the substrate, and a photosensitive area of the photosensitive chip corresponds to the light window of the molding base.

According to an embodiment of the present invention, the molding base is integrally bonded to a non-photosensitive area of the photosensitive chip.

According to an embodiment of the present invention, the photosensitive chip is attached to the chip holding portion of the photosensitive chip.

According to an embodiment of the present invention, the molding circuit board assembly further comprising at least one electronic component, wherein each of the electronic components is attached to the substrate, or each of the electronic components is completely or partially embedded in the substrate, and each of the electronic components is conductively connected to the digital circuit unit or the analog circuit unit.

a camera module, characterized by comprising:

at least one optical lens;

at least one photosensitive chip; and at least one circuit board, wherein the circuit board comprises a digital circuit unit, an analog circuit unit and a substrate, wherein the digital circuit unit and the analog circuit unit are respectively formed on the substrate, and the digital circuit unit and the analog circuit unit are conductively connected to each other, wherein at least one part of the analog circuit unit has a safe distance from the digital circuit unit, wherein the photosensitive chip is held in a chip holding portion of the circuit board, and the photosensitive chip is conductively connected to at least one circuit portion of the analog circuit unit and the digital circuit unit of the circuit board, the optical lens is held in the photosensitive path of the photosensitive chip.

According to an embodiment of the present invention, the camera module further comprising at least one lens frame, wherein the lens frame has at least one light through channel, wherein the lens frame is attached to the circuit board, and the photosensitive area of the photosensitive chip corresponds to the light through channel of the lens frame, and the light through channel of the lens frame forms a light path between the photosensitive chip and the optical lens.

According to an embodiment of the present invention, the camera module further comprising a molding base, wherein the molding base has at least one light window, wherein the molding base is integrally bonded to the circuit board, and the molding base surrounds the photosensitive area of the photosensitive chip such that a photosensitive area of the photosensitive chip corresponds to the light window of the molding base, and the light through channel of the lens frame forms a light path between the photosensitive chip and the optical lens.

According to an embodiment of the present invention, the molding base is integrally bonded to the non-photosensitive area of the photosensitive chip.

According to an embodiment of the present invention, the photosensitive chip is attached to the chip holding portion of the photosensitive chip.

According to an embodiment of the present invention, the camera module further comprising at least one bracket and at least one filter element, the bracket has at least one light through hole, the filter element is attached to the bracket, the bracket is attached to the molding base to hold the filter element between the optical lens and the photosensitive chip by the bracket.

According to an embodiment of the present invention, the camera module further comprising at least one electronic component, wherein each of the electronic components is attached on the substrate, or each of the electronic components is completely or partially embedded in the substrate, and each of the electronic components is conductively connected to the digital circuit unit or the analog circuit unit.

According to another aspect of the present invention, the present invention further provides an electronic device, comprising an electronic device body; and a camera module disposed in the electronic device body, wherein the camera module comprises:

at least one optical lens;
at least one photosensitive chip; and
at least one circuit board, wherein the circuit board comprises a digital circuit unit, an analog circuit unit and a substrate, wherein the digital circuit unit and the analog circuit unit are respectively formed on the substrate, and the digital circuit unit and the analog circuit unit are conductively connected to each other, wherein at least one part of the analog circuit unit has a safe distance from the digital circuit unit, wherein the photosensitive chip is held in a chip holding portion of the circuit board, and the photosensitive chip is conductively connected to at least one circuit portion of the analog circuit unit and the digital circuit unit of the circuit board, the optical lens is held in the photosensitive path of the photosensitive chip.

According to an embodiment of the present invention, the electronic device body is a smart phone, a tablet computer, a personal digital assistant, an electronic paper book, an MP3/4/5, an electronic book or a calculator.

According to another aspect of the present invention, the present invention provides a molding circuit board assembly, comprising:

a protecting portion;
at least one photosensitive chip;
a molding base, wherein the molding base has at least one light window; and
at least one circuit board, wherein the circuit board further comprises a substrate, wherein the substrate has at least one chip holding portion, at least one protecting area surrounding the chip holding portion, and at least one bonding area surrounding the protecting area, wherein the photosensitive chip is held in the chip holding portion of the substrate, wherein the protecting portion is located at least in the protecting area of the substrate, wherein the molding base is integrally bonded to the bonding area of the substrate, and the molding base surrounds the photosensitive area of the photosensitive chip such that the photosensitive area of the photosensitive chip corresponds to the light window of the molding base.

According to an embodiment of the present invention, the protecting portion is disposed at least in the protecting area of the substrate.

According to an embodiment of the present invention, the protecting portion is formed at least on the protecting area of the substrate.

According to an embodiment of the present invention, the protecting portion is disposed in the protecting area and the bonding area of the substrate.

According to an embodiment of the present invention, the protecting portion is formed on the protecting area and the bonding area of the substrate.

According to an embodiment of the present invention, the protecting portion is formed of ink applied to the substrate.

According to an embodiment of the present invention, the protecting portion is formed of glue applied to the substrate.

According to an embodiment of the present invention, the protecting portion has at least one opening, and a photosensitive area of the photosensitive chip corresponds to the opening of the protecting portion.

According to an embodiment of the present invention, the molding base is integrally bonded to a non-photosensitive area of the photosensitive chip.

According to another aspect of the present invention, the present invention further provides a camera module, comprising an optical lens and a molding circuit board assembly, wherein the molding circuit board assembly comprises:

a protecting portion;
at least one photosensitive chip;
a molding base, wherein the molding base has at least one light window; and
at least one circuit board, wherein the circuit board further comprises a substrate, wherein the substrate has at least one chip holding portion, at least one protecting area surrounding the chip holding portion, and at least one bonding area surrounding the protecting area, wherein the photosensitive chip is held in the chip holding portion of the substrate, wherein the protecting portion is located at least in the protecting area of the substrate, wherein the molding base is integrally bonded to the bonding area of the substrate, and the molding base surrounds the photosensitive area of the photosensitive chip such that the photosensitive area of the photosensitive chip corresponds to the light window of the molding base, wherein the optical lens is held in the photosensitive path of the photosensitive chip, and the light window of the molding base forms a light through channel between the photosensitive chip and the optical lens.

According to an embodiment of the present invention, the camera module further comprises at least one bracket and at least one filter element, the bracket has at least one light through hole, the filter element is attached to the bracket, the bracket is attached to the molding base to hold the filter element between the optical lens and the photosensitive chip by the bracket.

According to another aspect of the present invention, the present invention further provides an electronic device, comprising an electronic device body and at least one of the camera modules disposed in the electronic device body, wherein the camera module comprises at least one optical lens and a molding circuit board assembly, wherein the molding circuit board assembly comprises:

a protecting portion;

at least one photosensitive chip;

a molding base, wherein the molding base has at least one light window; and at least one circuit board, wherein the circuit board further comprises a substrate, wherein the substrate has at least one chip holding portion, at least one protecting area surrounding the chip holding portion, and at least one bonding area surrounding the protecting area, wherein the photosensitive chip is held in the chip holding portion of the substrate, wherein the protecting portion is located at least in the protecting area of the substrate, wherein the molding base is integrally bonded to the bonding area of the substrate, and the molding base surrounds the photosensitive area of the photosensitive chip such that the photosensitive area of the photosensitive chip corresponds to the light window of the molding base, wherein the optical lens is held in the photosensitive path of the photosensitive chip, and the light window of the molding base forms a light through channel between the photosensitive chip and the optical lens.

According to an embodiment of the present invention, the electronic device body is a smart phone, a tablet computer, a personal digital assistant, an electronic paper book, an MP3/4/5, an electronic book or a calculator.

According to another aspect of the present invention, the present invention further provides a manufacturing method of a molding circuit board assembly, wherein the manufacturing method comprises the following steps:

(a) providing a substrate with a protecting portion, wherein the protecting portion is located at least in a protecting area of the substrate;

(b) forming a molding base having at least one light window on a bonding area of the substrate by a molding process; and (c) conductively connecting a photosensitive chip to the substrate via the light window of the molding base to manufacture the molding circuit board assembly.

According to an embodiment of the present invention, in the step (a), the method further comprising the steps of:

providing the substrate; and disposing the protecting portion at least in the protecting area of the substrate.

According to an embodiment of the present invention, in the step (a), the method further comprising the steps of:

providing the substrate; and at least forming the protecting portion on the protecting area of the substrate.

According to an embodiment of the present invention, in the above method, the protecting portion is further formed on the bonding area of the substrate.

According to an embodiment of the present invention, in the step of forming the protecting portion on the protecting area of the substrate, the method further comprises the step of: at least applying ink to the protecting area of the substrate to form the protecting portion on the protecting area of the substrate by ink.

According to an embodiment of the present invention, in the step of at least forming the protecting portion on the protecting area of the substrate, the method further comprises the step of: at least applying glue to the protecting area of the substrate to form the protecting portion on the protecting area of the substrate by glue.

According to an embodiment of the present invention, in the step (b), the method further comprises the steps of:

placing the substrate into a lower die;

molding the upper die and the lower die in such a manner that the protecting portion is applied pressure by a light window molding block of an upper die such that the bonding area of the substrate is held in a molding space formed between the upper die and the lower die; and curing a molding material added to the molding space such that the molding material forms the molding base bonded to the bonding area of the substrate.

According to another aspect of the present invention, the present invention further provides a manufacturing method of a camera module, wherein the manufacturing method comprises the following steps:

providing a substrate with a protecting portion, wherein the protecting portion is located at least in a protecting area of the substrate;

forming a molding base having at least one light window on a bonding area of the substrate by a molding process;

conductively connecting a photosensitive chip to the substrate via the light window of the molding base; and maintaining an optical lens on an photosensitive path of the photosensitive chip to manufacture the camera module.

BRIEF DESCRIPTION OF THE DRAWINGS

FIG. 11 is a schematic view of a first manufacturing step of the camera module according to the above preferred embodiment of the present invention.

FIG. 12A is a schematic view of a second manufacturing step of the camera module according to the above preferred embodiment of the present invention.

FIG. 15 is a schematic view of a fifth manufacturing step of the camera module according to the above preferred embodiment of the present invention.

FIG. 16 is a schematic view of a sixth manufacturing step of the camera module according to the above preferred embodiment of the present invention.

DETAILEDCRIPTION OF THE INVENTION

Figure 1:
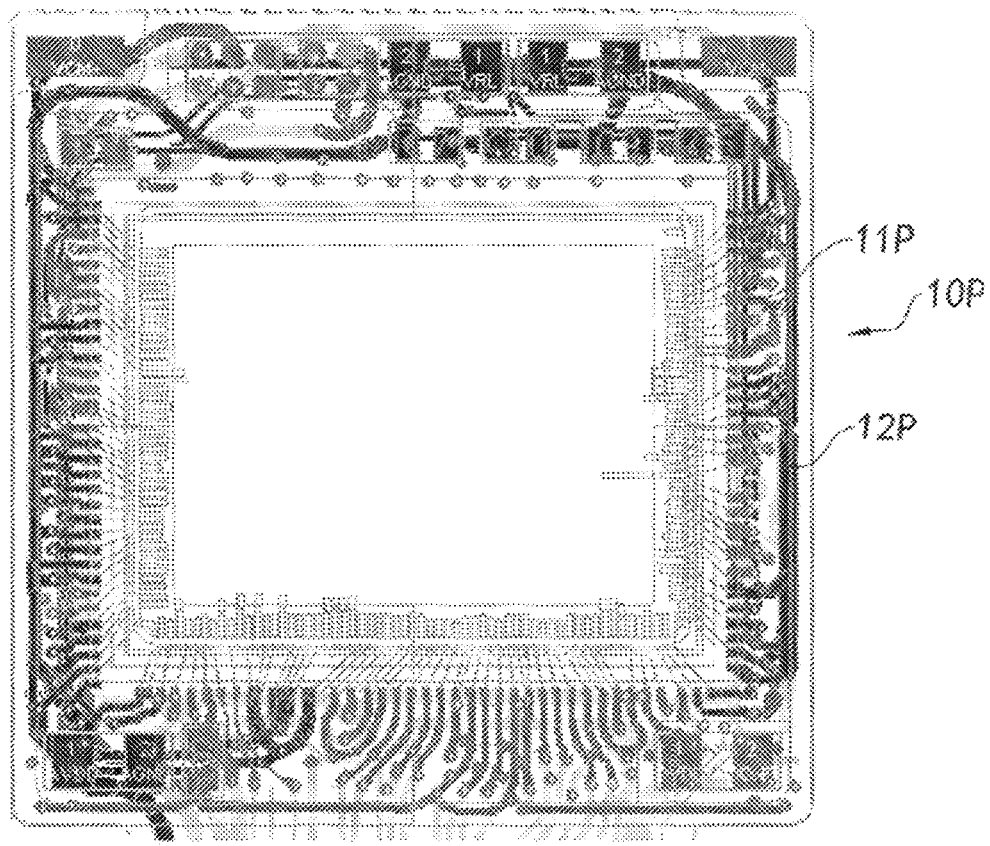
FIG. 1 is a schematic view of a circuit board of a conventional camera module.

The following description is presented to disclose the invention to enable those skilled in the art to practice the present invention. The preferred embodiments in the following description are by way of example only, and other obvious variations will occur to those skilled in the art. The basic principles of the invention as defined in the following description may be applied to other embodiments, modifications, improvements, equivalents, and other embodiments without departing from the spirit and scope of the invention.

It should be understood by those skilled in the art that in the disclosure of the present invention, the orientation or positional relationship of the indications of the terms "longitudinal", "transverse", "upper", "lower", "front", "back", "left", "right", "upright", "horizontal", "top", "bottom", "inside", "outside", or the like is based on the orientation or positional relationship shown in the drawings, which is merely for the convenience of describing the present invention, and it is not indicated or implied that the device or component referred to must have a particular orientation, constructed and operated in a particular orientation, therefore, the above terms are not to be construed as limitation of the present invention.

It will be understood that the term "a" is understood as "at least one" or "one or more", that is, in one embodiment, the number of one element may be one, and in other embodiments, the number of the element can be multiple, and the term "a" cannot be construed as limiting the quantity.

Referring to FIGS. 2 to 4A of the accompanying drawings of the present invention, a camera module 1 in accordance with a preferred embodiment of the present invention is illustrated in following description, wherein one or more of the camera modules 1 can be disposed in an electronic device body 2 to form an electronic device, and the camera module 1 is used to help the electronic device acquire an image.

Figure 2:
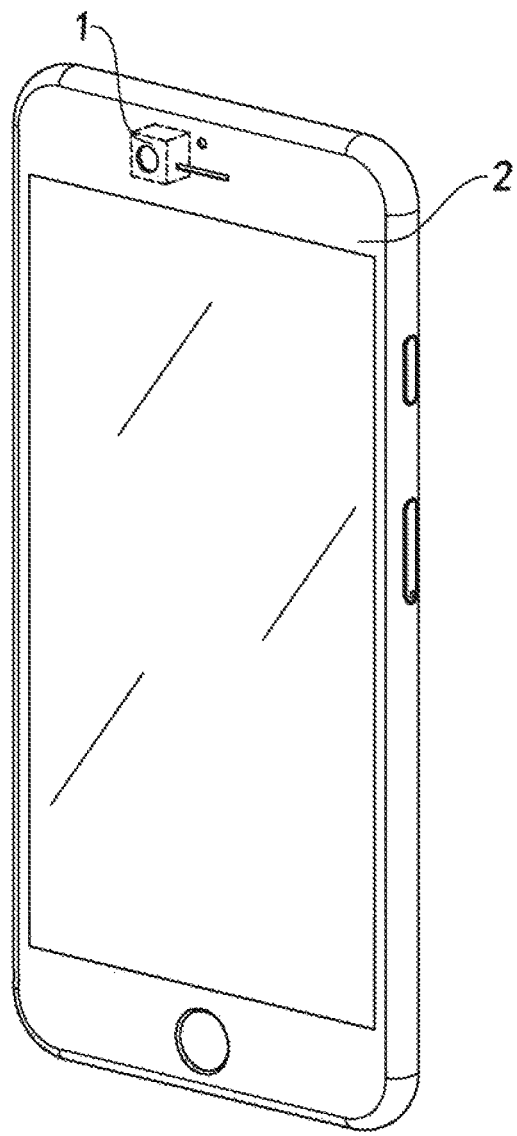
FIG. 2 is a stereoscopic schematic diagram of an electronic device according to a preferred embodiment of the present invention.

It is to be noted that, in the specific exemplary embodiment of the electronic device shown in FIG. 2, taking the camera module 1 disposed in the rear of the electronic device body 2 as an example, those skilled in the art can be understood that, in other exemplary embodiments of the electronic device, the camera module 1 may also be disposed in front of the electronic device body 2 or other positions, or at least one of the camera modules 1 is disposed in front of the electronic device body 2 and at least one of the camera modules 1 are disposed in the rear of the electronic device body 2. Therefore, the specific exemplary embodiment of the electronic device shown in FIG. 2 should not be considered as limiting the content and scope of the camera module 1 of the present invention.

It is to be noted that the type of the electronic device body 2 is also not limited, for example, the electronic device body 2 can be implemented as a smart phone such as that shown in FIG. 2, in other exemplary embodiments, the electronic device body 2 can also be implemented as, but not limited to, a tablet computer, a personal digital assistant, an electronic paper book, an MP3/4/5, an electronic book, a calculator, and the like.

In addition, it is to be noted that the camera module 1 can be implemented as a single-lens camera module, or can be implemented as an array camera module, such as a dual-lens camera module, a three-lens camera module, and the like. In the following description, taking the camera module 1 is implemented as a single-lens camera module as an example to illustrate the features and advantages of the camera module 1 of the present invention, but it should not be considered as limitations on the content and scope of the camera module 1 of the present invention.

Figure 3:
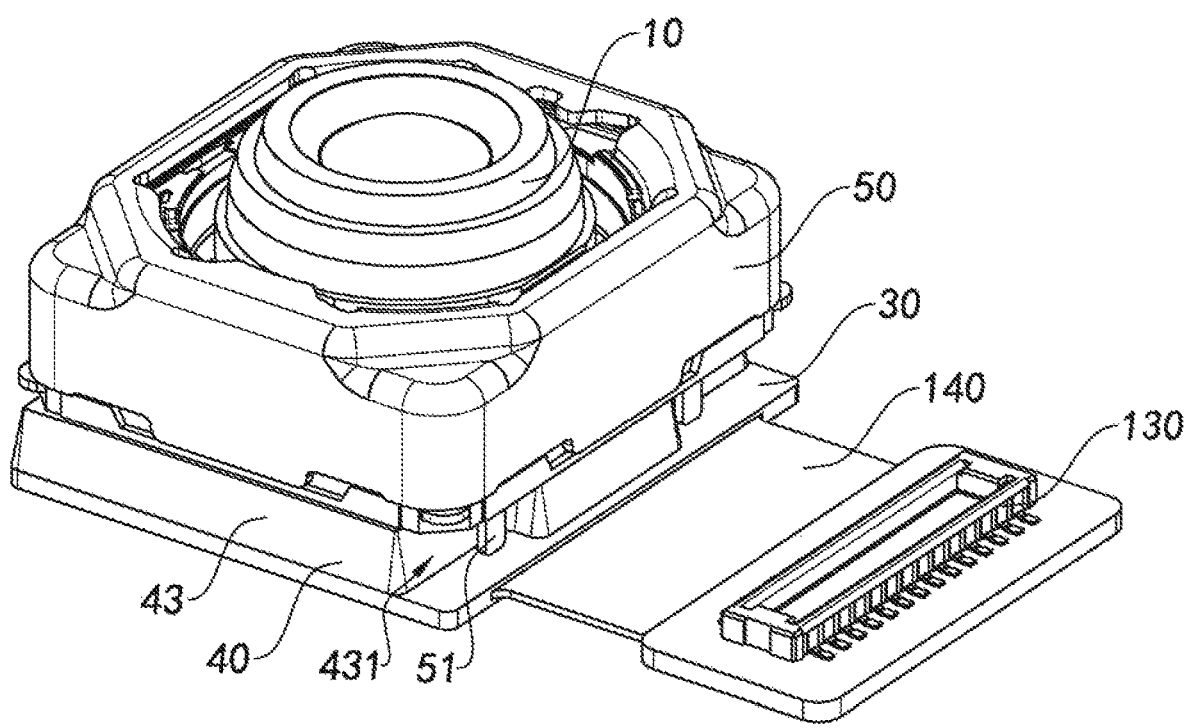
FIG. 3 is a stereoscopic schematic view of a camera module according to the above preferred embodiment of the present invention.
Figure 4A:
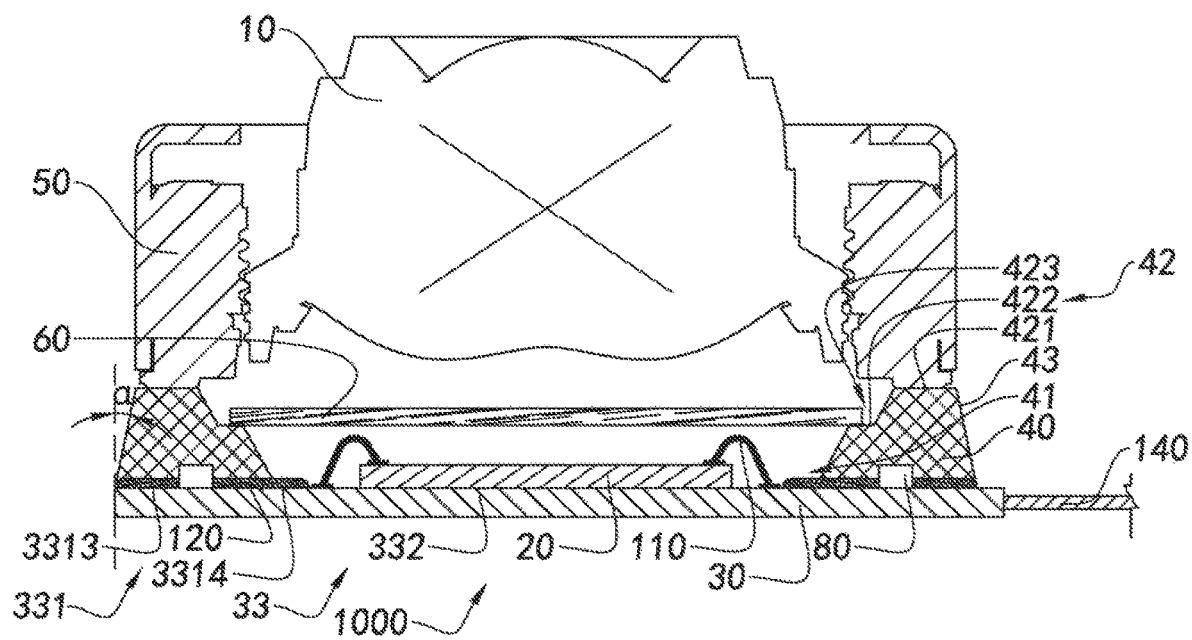
FIG. 4A is a sectional schematic view of the camera module according to the above preferred embodiment of the present invention taken along its intermediate position.

Further, according to a specific exemplary embodiment of the camera module 1 shown in FIGS. 3 and 4A, wherein the camera module 1 comprise at least one optical lens 10, at least one photosensitive chip 20, and at least one circuit board 30, wherein the photosensitive chip 20 and the circuit board 30 are conductively connected, the optical lens 10 is held in a photosensitive path of the photosensitive chip 20, wherein light reflected by the object enters into the camera module 1 from the optical lens 10, and then is received and photo-electrically converted to form an electrical signal relating to the image of the object by the photosensitive chip 20.

The circuit board 30 may be electrically connected to the electronic device body 2, wherein the electrical signal can be transmitted from the photosensitive chip 20 to the electronic device body 2 by the circuit board 30 to enable the electrical signal to be stored in the electronic device body 2, or enable an image of the object to be displayed through the display screen of the electronic device body 2. That is, the electronic device body 2 can convert the electrical signal relating to the image of the object formed by the photosensitive chip 20 into an image format, and can be displayed through the display screen of the electronic device body 2.

With further reference to FIG. 4A, the camera module 1 further includes a molding base 40, wherein the molding base 40 has at least one light window 41, wherein the molding base 40 can be integrally bonded to the circuit board 30, such that the photosensitive area of the photosensitive chip 20 can correspond to the light window 41 of the molding base 40, thereby the light window 41 of the molding base 40 forms the a light through path of the photosensitive chip 20 and the optical lens 10 to allow light reflected by an object from the optical lens 10 to enter the inside of the camera module 1 to pass through the light through path formed by the light window 41, and then is received and photo-electrically converted by the photosensitive chip 20.

In one exemplary embodiment, the molding base 40 may be integrally bonded to the circuit board 30, and then the photosensitive chip 20 may be conductively connected to the circuit board 30 through the light window 41 of the molding base 40. In another exemplary embodiment, the photosensitive chip 20 and the circuit board 30 may be conductively connected first, and then the molding base 40 may be integrally bonded to the circuit board 30. The camera module 1 of the present invention is not limited in this regard.

Preferably, the molding base 40 may further be integrally bonded to at least a part of the non-photosensitive area of the photosensitive chip 20 such that the molding base 40, the circuit board 30, and the photosensitive chip 20 are integrated. For example, the photosensitive chip 20 and the circuit board 30 may be conductively connected first, and then the molding base 40 is integrally bonded to the circuit board 30 and at least a part of the non-photosensitive area of the photosensitive chip 20, such that the molding base 40, the circuit board 30, and the photosensitive chip 20 are integrated in such a manner that at least a part of the non-photosensitive area of the photosensitive chip 20 is embedded.

It will be understood that at least one photosensitive chips 20, at least one circuit boards 30 and at least one molding bases 40 form a molding circuit board assembly 1000. That is, the camera module 1 comprises at least one optical lenses 10 and at least one molded circuit board assemblies 1000, wherein the molding circuit board assembly 1000 further includes at least one photosensitive chips 20, at least one circuit boards 30 and at least one molding bases 40, the molding base 40 has at least one light windows 41, the photosensitive chip 20 and the circuit board 30 are conductively connected, the molding base 40 is integrally bonded to the circuit board 30, and a photosensitive area of the photosensitive chip 20 corresponds to the light window 41 of the molding base 40, and the optical lens 10 is held in the photosensitive path of the photosensitive chip 20. Preferably, the molding base 40 further embedded at least a part of the non-photosensitive area of the photosensitive chip 20.

In addition, the camera module 1 may be a fixed focus camera module or a zoom camera module. When the camera module 1 is implemented as the fixed focus camera module, the optical lens 10 can be directly attached to a top surface 42 of the molding base 40, such that the optical lens 10 is held in the photosensitive path of the photosensitive chip 20; or the optical lens 10 is assembled to a lens barrel, the lens barrel are attached to the top surface 42 of the molding base 40, such that the optical lens 10 is held in a photosensitive path of the photosensitive chip 20; or the lens barrel integrally extends from the top surface 42 of the molding base 40, and the optical lens 10 is assembled to the lens barrel, such that the optical lens 10 is held in the photosensitive path of the photosensitive chip 20.

With reference to FIG. 4A, the camera module 1 further comprises at least one driver 50, wherein the optical lens 10 is drivably disposed in the driver 50, and the driver 50 is attached to the top surface 42 of the molding base 40, such that the optical lens 10 is held in the photosensitive path of the photosensitive chip 20. The driver 50 can drive the optical lens 10 to be displaced along the photosensitive path of the photosensitive chip 20 to adjust the distance between the optical lens 10 and the photosensitive chip 20, such that the camera module 1 forms the zoom camera module.

The driver 50 and the circuit board 30 are conductively connected. Specifically, the driver 50 is provided with a set of driver pins 51, the driver pins 51 of the driver 50 extends from the top surface 42 of the molding base 40 toward direction of the circuit board 30 and is electrically connected to the circuit board 30.

Preferably, an outer surface 43 of the molding base 40 is provided with at least one pin groove 431, wherein the pin groove 431 extends from the top surface 42 of the molding base 40 toward direction of the circuit board 30, the driver pin 51 of the driver 50 is held in the pin groove 431 of the molding base 40. In this way, the driver pin 51 of the driver 50 is not protruded from the outer surface 43 of the molding base 40, such that, on one hand, the driver pin 51 can be prevented from being touched to cause a defect that affects the reliability of the driver 50, on the other hand, the integrity of the appearance of the camera module 1 can be ensured. Preferably, the pin groove 431 of the outer surface 43 of the molding base 40 is formed when the molding base 40 is molded.

The outer surface 43 of the molding base 40 is an inclined surface to facilitate the demolding of the molding die 100 after the molding base 40 is formed by a molding die 100 in a molding process. Of course, it will be understood by those skilled in the art that, in other exemplary embodiments, the tilt angle of the outer surface 43 of the molding base 40 is formed by a cutting process. Further, the parameter of angle formed by the outer surface 43 of the molding base 40 and the optical axis of the photosensitive chip 20 is α, wherein the parameter a is an acute angle.

It is to be noted that the type of the driver 50 is not limited in the camera module 1 of the present invention. For example, the driver 50 can be implemented as, but not limited to, a voice coil motor.

Continuously referring to FIG. 4A, the camera module 1 further comprises at least one filter element 60, wherein the filter element 60 is held between the optical lens 10 and the photosensitive chip 20 to enable the light entering into the camera module 1 from the optical lens 10 can be received and photo-electrically converted by the photosensitive chip 20 after being filtered by the filter element 60, wherein the filter element 60 is capable of filtering stray light in the light entering the interior of the camera module 1 from the optical lens 10 to improve the imaging quality of the camera module 1. The type of the filter element 60 is not limited in the camera module 1 of the present invention, for example, the filter element 60 may be implemented as, but not limited to, an infrared filter.

It will be understood by those skilled in the art that the filter element 60 can also form a part of the molding circuit board assembly 1000.

In one exemplary embodiment of the camera module 1, referring to FIG. 4A, the filter element 60 is attached to the top surface 42 of the molding base 40 to enable the filter element 60 to be held between the optical lens 10 and the photosensitive chip 20.

Specifically, the top surface 42 of the molding base 40 forms at least one outer side surface 421 and at least one inner side surface 422, wherein the driver 50 is attached to the outer side surface 421 of the molding base 40, the filter element 60 is attached to the inner side surface 422 of the molding base 40.

In one exemplary embodiment, the plane wherein the outer side surface 421 of the molding base 40 is located has a same height as the plane wherein the inner side surface 422 is located, that is, the top surface 42 of the molding base 40 is a plane. In another exemplary embodiment, the outer side surface 421 and the inner side surface 422 of the molding base 40 have a height difference, for example, the plane wherein the outer side surface 421 of the molding base 40 is located is higher than the plane wherein the inner surface 422 is located, thereby forming at least one filter attaching groove 423, wherein the filter attaching groove 423 communicates with the light window 41, wherein the filter element 60 attached to the inner side surface 422 of the molding base 40 is accommodated in the filter attaching groove 423 to reduce the height of the camera module 1 and improve the stability of the filter element 60.

In another exemplary embodiment of the camera module 1, before the molding base 40 is formed, the filter element 60 may be first directly or indirectly fixed on the photosensitive chip 20, for example, the filter element 60 may directly cover the photosensitive chip 20, such that the filter element 60 contacts with the photosensitive chip 20, or a support is disposed between the filter element 60 and the photosensitive chip 20, such that the filter element 60 has a safe distance from the photosensitive chip 20, and then the molding base 40 is molded by a molding process such that the outer edge of the filter element 60 is further embedded by the molding base 40, thereby the filter element 60, the molding base 40, the circuit board 30, and the photosensitive chip 20 are integrated.

Figure 4B:
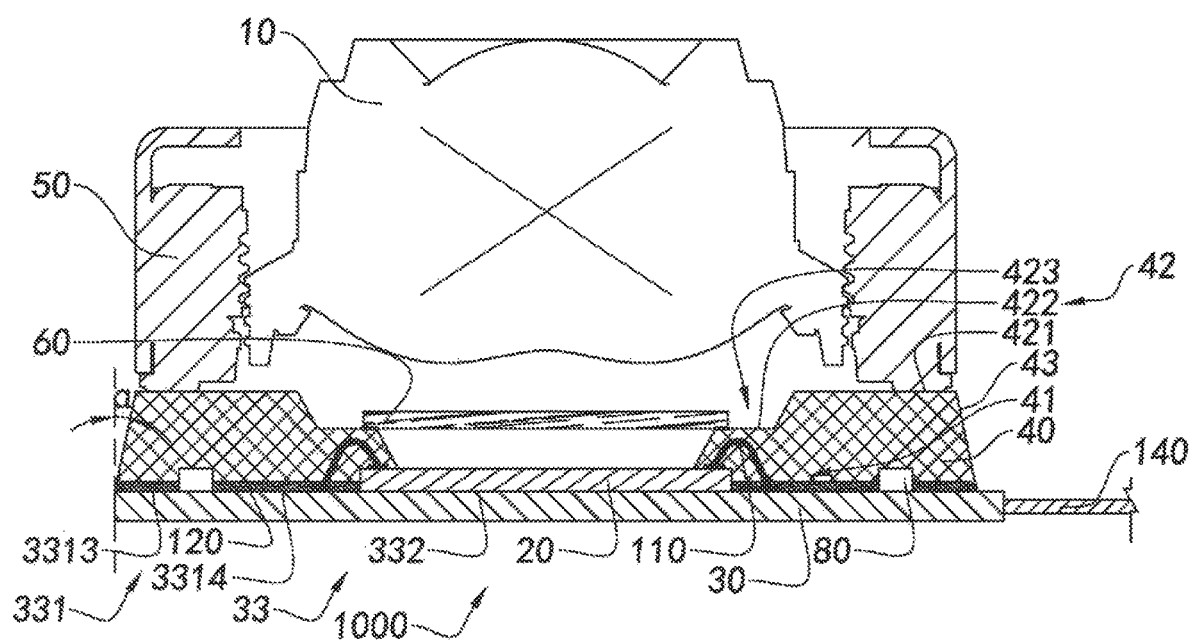
FIG. 4B is a sectional schematic view of a variant embodiment of the camera module according to the above preferred embodiment of the present invention taken along its intermediate position.
Figure 4C:
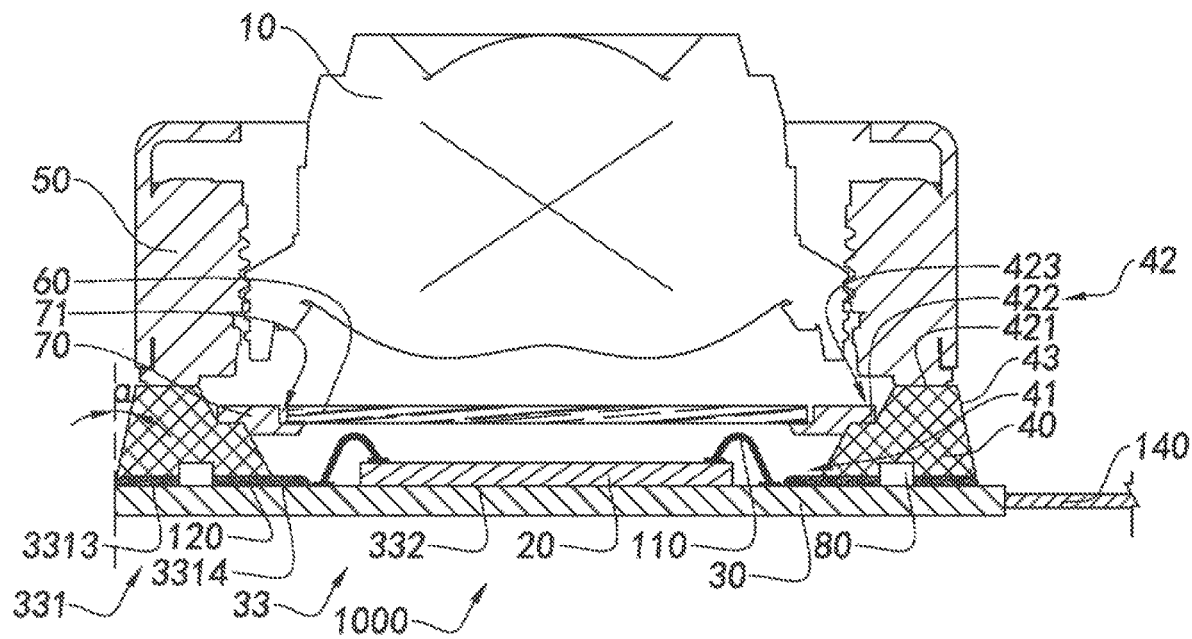
FIG. 4C is a sectional schematic view of another variant embodiment of the camera module according to the above preferred embodiment of the present invention taken along its intermediate position.

In another exemplary embodiment, referring to FIG. 4B, the molding base 40 of the camera module 1 may be further bonded to the non-photosensitive areas of the photosensitive chip 20 to further reduce the length and width of the camera module 1. Specifically, in this specific exemplary embodiment of the camera module 1 of the present invention, the photosensitive chip 20 may be first attached to the circuit board 30, and then a molding process is performed to form the molding base 40, and the molding base 40 is bonded to the non-photosensitive area of the photosensitive chip 20. In another exemplary embodiment, referring to FIG. 4C, the camera module 1 may further include a bracket 70, wherein the bracket 70 has a light through hole 71, and the filter element 60 is attached to the bracket 70 to close the light through hole 71, wherein the bracket 70 is attached to the inner side surface 422 of the molding base 40, such that the filter element 60 is held between the optical lens 10 and the photosensitive chips 20, in this way, the size of the filter element 60 can be reduced, such that the material cost of the camera module 1 is reduced.

Further, the camera module 1 may further include at least one electronic component 80, wherein the electronic component 80 is attached to the circuit board 30, or the electronic component 80 may be partially or completely embedded into the substrate 33. In an exemplary embodiment where the electronic component 80 is partially embedded into the substrate 33 and the electronic component 80 is attached to a surface of the substrate 33, the molding base 40 may embed at least a part of at least one of the electronic component 80. Preferably, the molding base 40 embeds a part of the electronic component 80 located on the upper surface of the circuit board 30 or embeds all of the electronic components 80, in this way, on one hand, the molding base 40 can separate the electronic component 80 and the outside air to prevent the surface of the electronic component 80 from being oxidized, on the other hand, the molding base 40 can separate adjacent electronic components 80, which can not only preventing the adjacent electronic components 80 from interfering with each other, but also can make the separation of the adjacent electronic components 80 closer, such that a larger number and size of the electronic component 80 is attached to the limited area of the circuit board 30, and on the other hand, the molding base 40 can separate the electronic component 80 and the photosensitive chip 20 to prevent the photosensitive area of the photosensitive chip 20 from contaminating by contamination, such as solder powder or debris, generated on the surface of the electronic component 80 or the soldering position of the electronic component 80 and the circuit board 30.

It is to be noted that the type of the electronic component 80 is not limited in the camera module 1 of the present invention. For example, the electronic component 80 can be implemented as, but not limited to, a resistor, a capacitor, a processor, relays, etc.

Figure 4D:
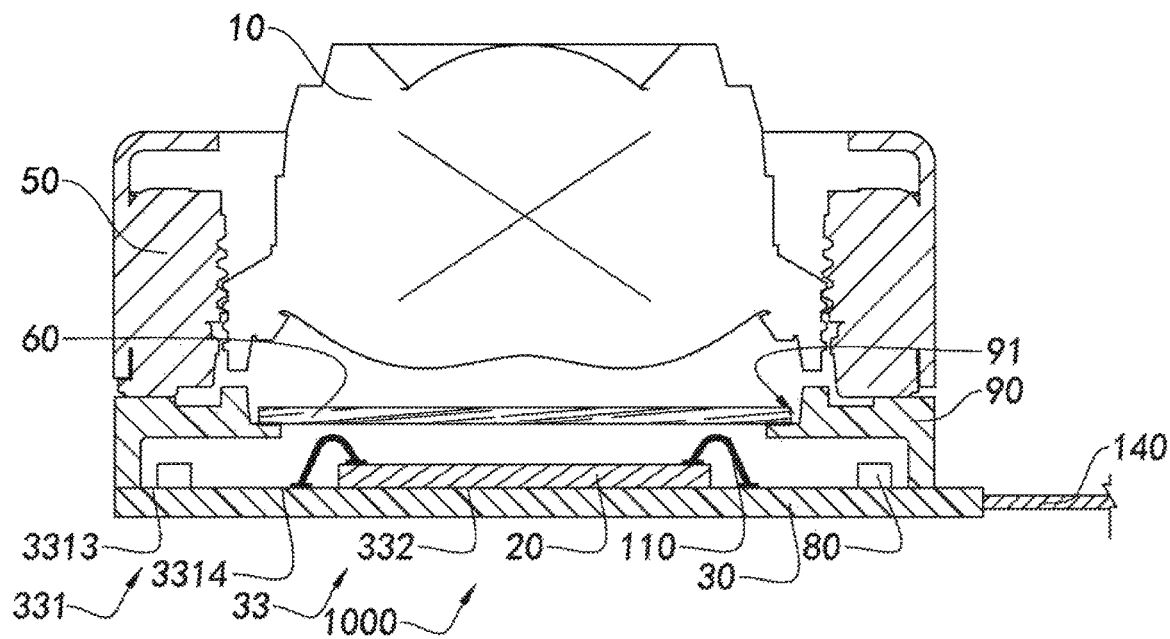
FIG. 4D is a sectional schematic view of another variant embodiment of the camera module according to the above preferred embodiment of the present invention taken along its intermediate position.

FIG. 4D illustrates the camera module 1 according to a variant embodiment of the present invention, wherein the camera module 1 may be free of the molding base 40, specifically, the camera module 1 comprises at least a lens frame 90, wherein the lens frame 90 has at least one light through channel 91, wherein the lens frame 90 is attached to the circuit board 30 after the photosensitive chip 20 and the circuit board 30 are conductively connected, and the photosensitive area of the photosensitive chip 20 is corresponded to the light through channel 91 of the lens frame 90, wherein the optical lens 10 can be directly or indirectly disposed in the lens frame 90, such that the optical lens 10 is held in the photosensitive path of the photosensitive chip 20, thereby the light entering into the camera module 1 from the optical lens 10 is received and photo-electrically converted by the photosensitive chip 20 after passing through the light through channel 91 of the lens frame 90.

When the camera module 1 is used, the light reflected by the object is received and photo-electrically converted by the photosensitive chip 20 to form an electrical signal of an image relating to the object after entering into the camera module 1 from the optical lens 10. It can be understood by those skilled in the art that the electrical signal is processed and transmitted to the electronic device body 2 by the circuit board 30 of the camera module 1, and of course, it is also possible that the electrical signal is transmitted to other devices. In the camera module 1 of the present invention, the stability of the circuit board 30 as processing and transmitting the electrical signal is effectively improved to ensure high performance of the camera module 1.

Figure 5:
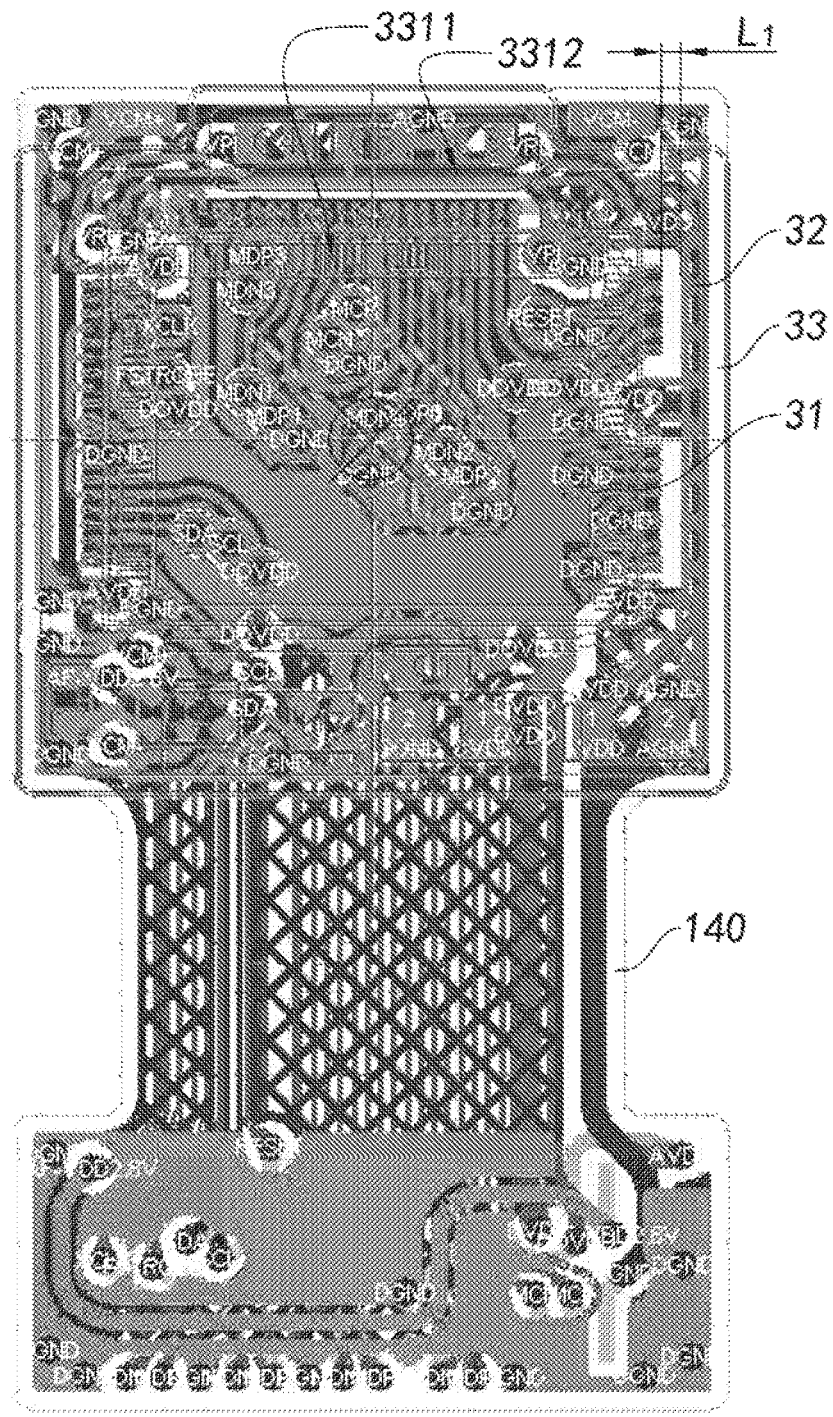
FIG. 5 is a top schematic view of a circuit board of the camera module according to the above preferred embodiment of the present invention, illustrating a relationship between a digital circuit unit, an analog circuit unit, and a substrate of the circuit board.
Figure 6:
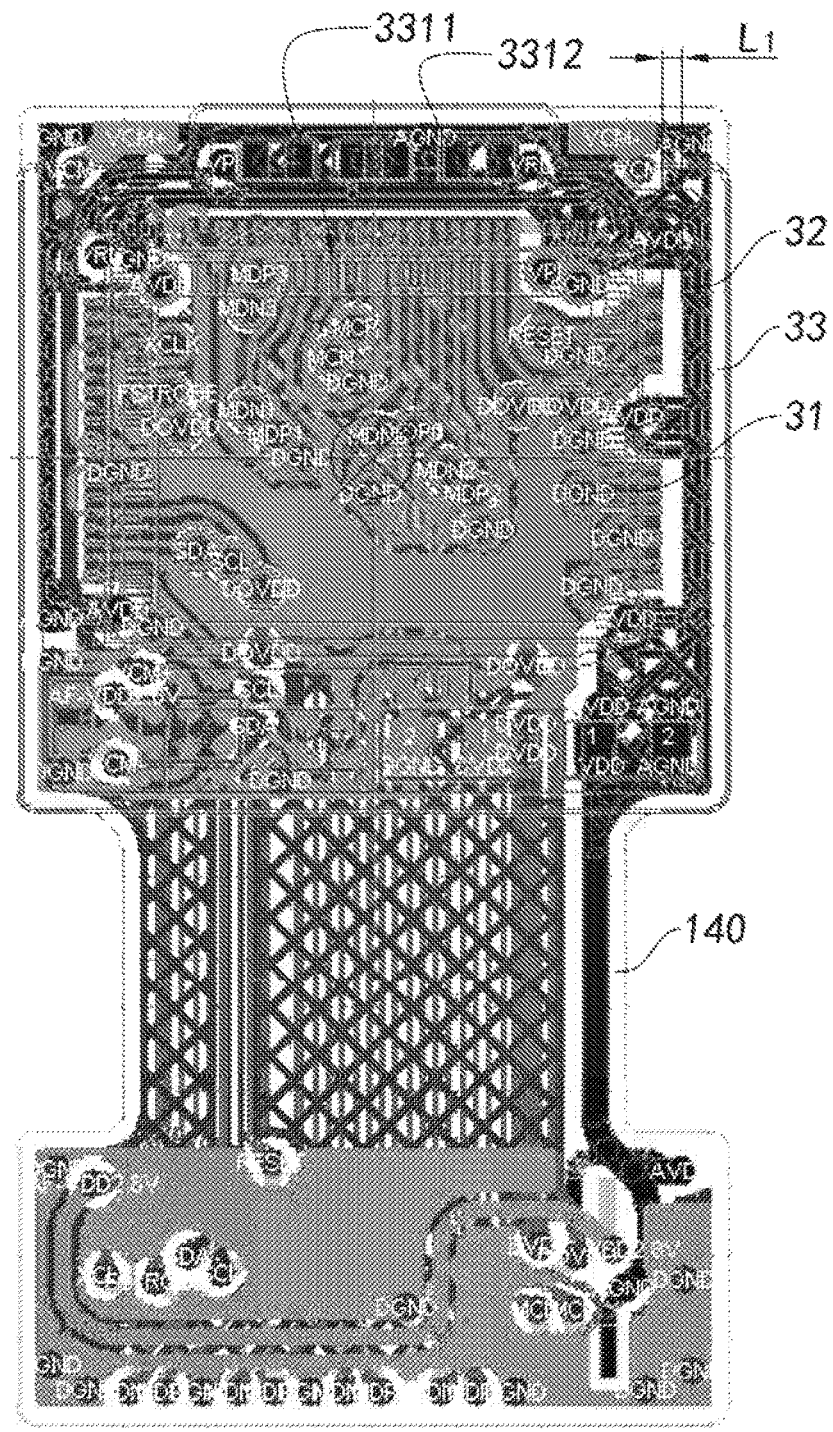
FIG. 6 is a top schematic view of the circuit board of the camera module according to the above preferred embodiment of the present invention, illustrating the relationship between the digital circuit unit and the substrate of the circuit board.
Figure 7:
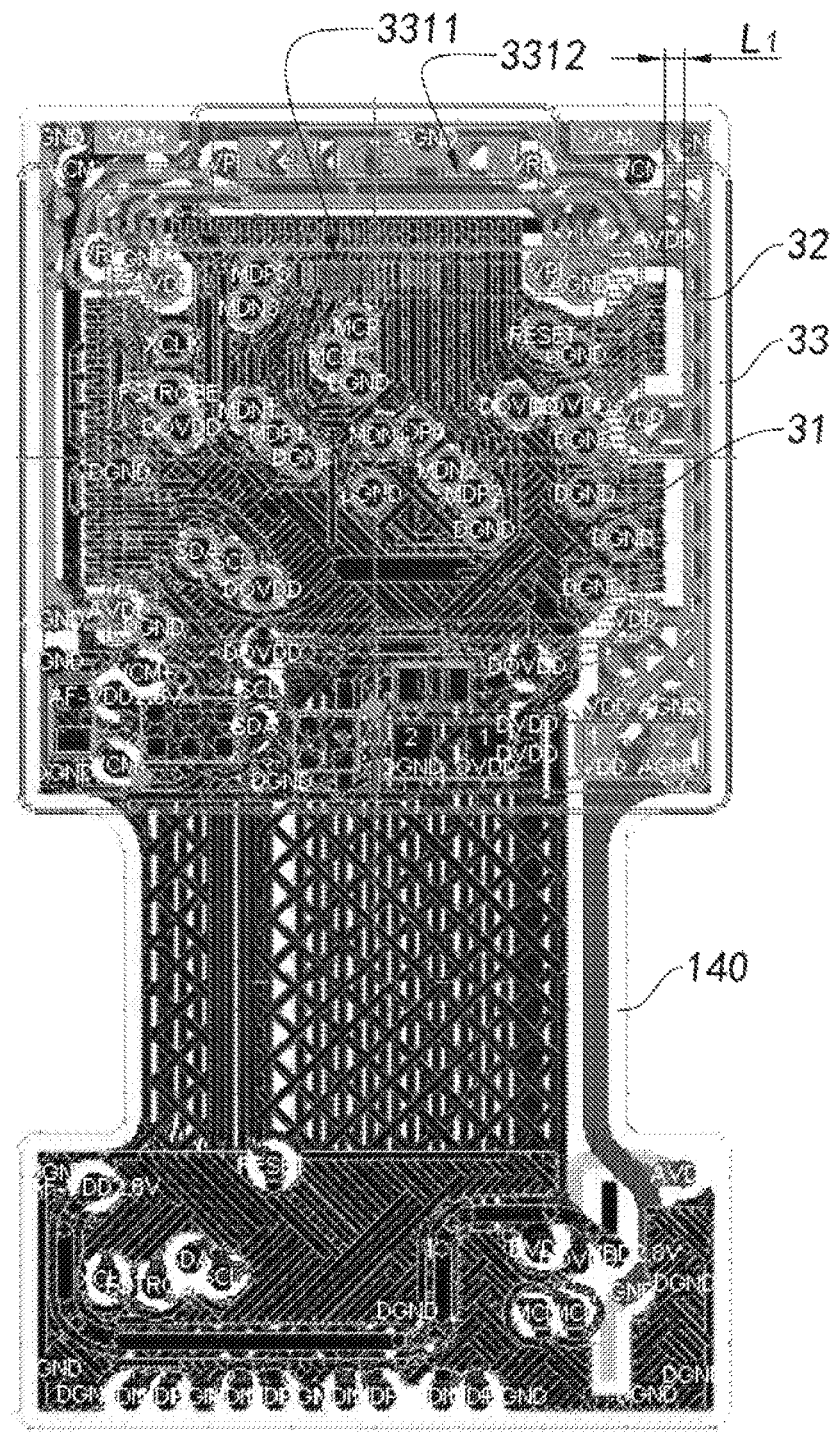
FIG. 7 is a top schematic view of the circuit board of the camera module according to the above preferred embodiment of the present invention, illustrating the relationship between the analog circuit unit and the substrate of the circuit board.

Referring to FIGS. 5-7, the circuit board 30 further includes at least one digital circuit unit 31, at least one analog circuit unit 32, and a substrate 33, wherein the digital circuit unit 31 and the analog circuit unit 32 are respectively formed on different areas of the substrate 31, and the digital circuit unit 31 and the analog circuit unit 32 are communicably conducted, respectively, the photosensitive chip 20 is conductively connected to the digital circuit unit 31 and the analog circuit unit 32 of the circuit board 30. The electrical signal formed by the photosensitive chip 20 can be transmitted from the digital circuit unit 31 and the analog circuit unit 32 to each of the electronic component 80 and a connector 130.

It is to be noted that the digital circuit unit 31 to which the present invention relates is a set of the circuit board 30 formed of digital circuits, wherein the digital circuit is for processing a digital signal (Digital Signal), wherein the digital signal is a signal that is discrete (quantized) in both time and amplitude, The values quantized by the electrical signal are respectively encoded into a sequence consisting of only two numbers 0 and 1, and the corresponding number is generated by the pulse signal generator, wherein the digital signal includes, but is not limited to, MIPI (Digital Transmission Type Digital Signal), IIC (Digital Control Class Signal), MCLK (Digital Clock Signal), DVDD/DGND (Digital Power Supply), and the like. Accordingly, the analog circuit unit 32 to which the present invention relates is a set of circuit boards 30 formed by analog circuits, wherein the analog circuit is for processing the analog signal (Analog Signal), wherein the analog signal refers to a continuous time, continuous amplitude signal, wherein the analog signal includes, but is not limited to, AVDD/AGND (analog power supply), VTG/VRGSL (analog voltage reference), and the like.

It is to be noted that the connector 130 may be directly disposed in the substrate 33 or indirectly disposed in the substrate 33 through a connecting plate 140 such as a soft board, a hard and soft board, a hard board, a ceramic board, or the like, and the connector 130 is connected to the digital circuit unit 31 and the analog circuit unit 32. Subsequently, after the camera module 1 is attached to the electronic device body 2, the connector 130 and a device such as the circuit board of the electronic device body 2 or the like are connected to each other, such that the electrical signal formed by the photosensitive chip 20 can be transmitted from the digital circuit unit 31 and the analog circuit unit 32 to the electronic device body 2 through the connector 130.

It will be understood by those skilled in the art that the digital circuit unit 31 and the analog circuit unit 32 of the circuit board 30 are both formed by the circuit disposed in the substrate 33 and the electronic component 80 attached to the substrate 33 or embedded in the substrate 33. Specifically, the digital circuit unit 31 includes the circuit disposed in the substrate 33 and at least one of the electronic components 80 attached to the substrate 33 or embedded in the substrate 33, the analog circuit unit 32 includes a circuit disposed in the substrate 33 and at least one of the electronic components 80 attached to the substrate 33 or embedded in the substrate 33.

The digital circuit unit 31 and the analog circuit unit 32 of the circuit board 30 in the present invention are formed on different areas of the substrate 33, in this way, the electromagnetic waves generated by the circuit of the digital circuit unit 31 of the circuit board 30 can be prevented from interfering with the electrical signals transmitted and processed by the analog circuit unit 32.

Specifically, at least a part of the analog circuit unit 32 of the circuit board 30 has a safe distance from the digital circuit unit 31 to prevent electromagnetic wave generated by the circuit of the digital circuit unit 31 interfering with the electrical signals transmitted and processed by the analog circuit unit 32.

Figure 20A:
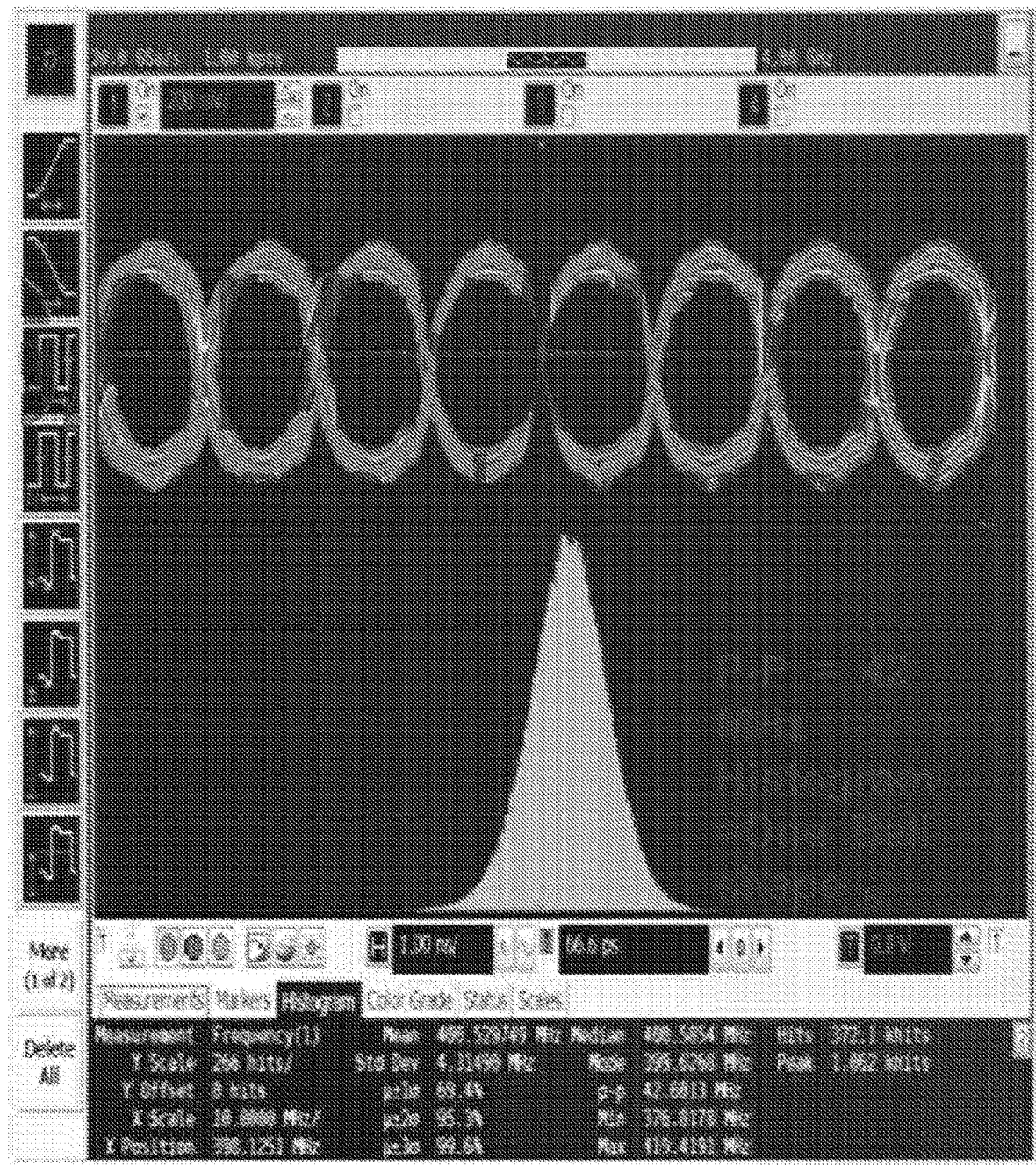
FIG. 20A is a schematic view showing the interference of the tested MIPI signal of the camera module according to the above preferred embodiment of the present invention.
Figure 20B:
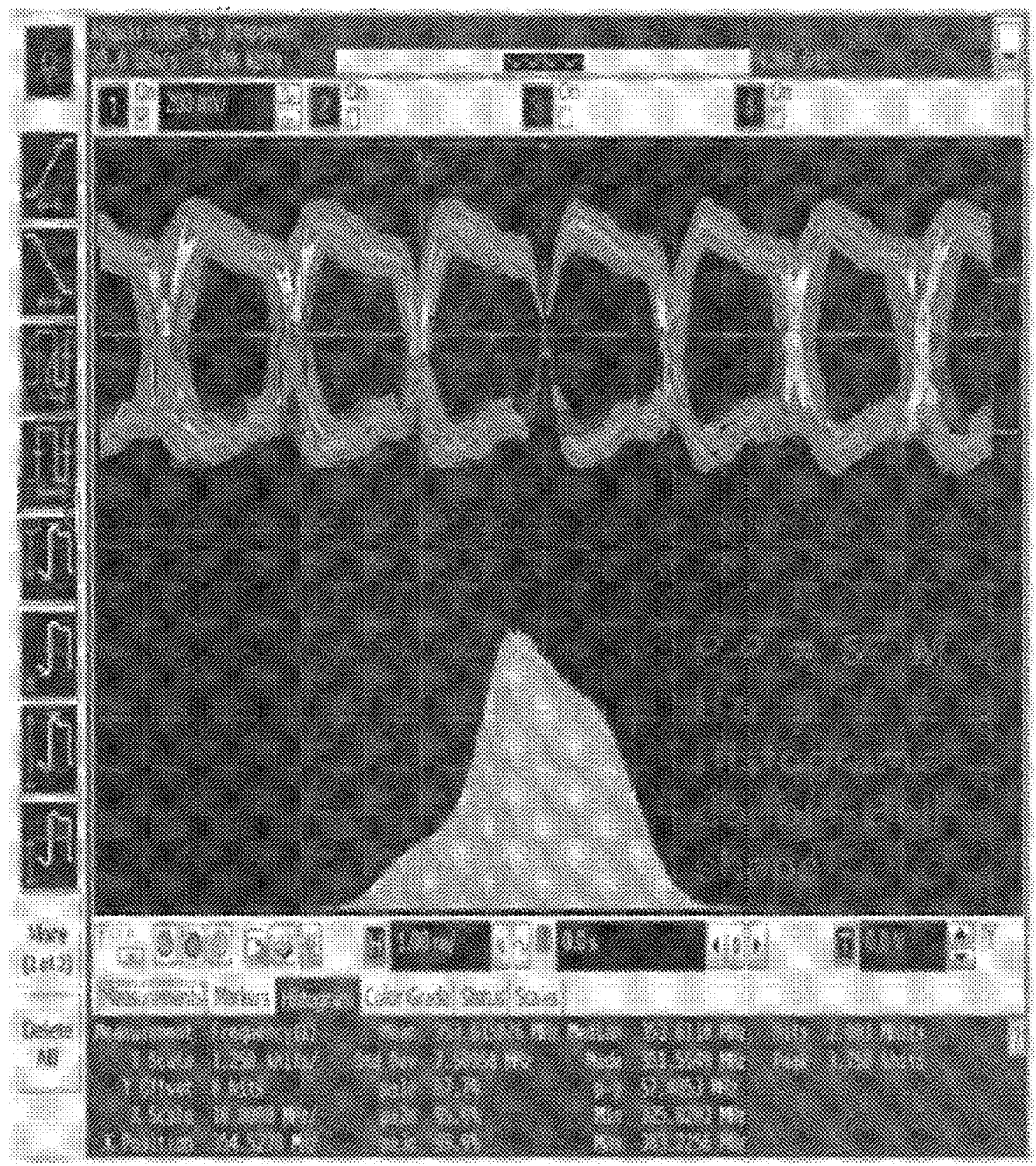
FIG. 20B is a schematic view of the interference of the tested MIPI signal of the conventional camera module.

FIG. 20A is a diagram showing the interference of the tested MIPI signal of the camera module 1 of the present invention, and FIG. 20B is a diagram showing the interference of the tested MIPI signal of the camera module of the prior art. By comparing the test results shown in FIGS. 20A and 20B, it can be found that in the camera module of the present invention, the safety distance is formed between at least a part of the analog circuit unit 32 of the circuit board 30 and the digital circuit unit 31, and the degree of interference of the MIPI signal can be reduced.

40%~100% of the part of the analog circuit unit 32 has the safe distance from the digital circuit unit 31. Preferably, 70%~99% of the part of the analog circuit unit 32 has the safety distance from the digital circuit unit 31. The safety distance parameter between the analog circuit unit 32 and the digital circuit unit 31 is L1, wherein the parameter L1 has a value range of 0.02 mm~0.5 mm (including 0.02 mm and 0.5 mm) Preferably, the parameter L1 has a value range of 0.1 mm to 0.4 mm (including 0.1 mm and 0.4 mm) The substrate 33 has at least one circuit disposing portion 331 and a chip holding portion 332, wherein the digital circuit unit 31 and the analog circuit unit 32 are formed on the circuit disposing portion 331 of the substrate 33, the photosensitive chip 20 is disposed in the chip holding portion 332 of the substrate 33.

In this exemplary embodiment of the camera module 1 of the present invention, the circuit disposing portion 331 further has a digital circuit area 3311 and an analog circuit area 3312, wherein the digital circuit unit 31 is formed with a circuit disposed in the digital circuit area 3311 of the circuit disposing portion 331 and the electronic component 80 located in the digital circuit area 3311, and the analog circuit unit 32 is formed with a circuit disposed in analog circuit area 3312 of the circuit disposing portion 331 and the electronic component 80 located in the analog circuit area 3312, such that the circuit of the digital circuit unit 31 and the circuit of the analog circuit unit 32 are no longer mixed together, thereby being able to prevent the electromagnetic waves generated by the circuits of the digital circuit unit 31 from interfering with the electrical signals transmitted and processed by the analog circuit unit 32 to ensure the communication capability of the circuit board 30.

The analog circuit unit 32 is formed on the analog circuit area 3312 of the circuit disposing portion 331, such that the circuit of the analog circuit unit 32 and the electronic component 80 are integrated to make the circuit board 30 more simple. The analog circuit unit 32 surrounds at least two sides of the chip holding portion 332 of the substrate 33, such that the analog circuit unit 32 surrounds at least two sides of the photosensitive chip 20. The analog circuit unit 32 may be, but not limited to, an "L" shape, a "C" shape, an unclosed "O" shape, or the like.

Referring to FIG. 5, the chip holding portion 332 of the substrate 33 is implemented as a flat attaching part for attaching the photosensitive chip 20. Preferably, the chip holding portion 332 is located at a middle part of the substrate 33.

The circuit board 30 further includes at least one substrate connector 34, wherein each of the substrate connectors 34 is disposed in the circuit disposing portion 331 of the substrate 33, and each of the substrate connectors 34 is electrically connected to the digital circuit unit 31 or the analog circuit unit 32, for example, each of the substrate connectors 34 may be disposed in the digital circuit area 3311 of the circuit disposing portion 331 of the substrate 33, respectively.

The non-photosensitive area of the photosensitive chip 20 has at least one chip connector 21. After the photosensitive chip 20 is attached to the chip holding portion 332 of the substrate 33 to hold the photosensitive chip 20 in the chip holding portion 332, the chip connector 21 of the photosensitive chip 20 and the substrate connector 34 of the circuit board 30 are connected through a conductive medium 110, such that the photosensitive chip 20 and the circuit board 30 are conductively connected. For example, the conductive medium 110 may be implemented as a lead which may be formed between the chip connector 21 of the photosensitive chip 20 and the substrate connector 34 of the circuit board 30 by a wiring process. The conductive medium 110 is implemented as the lead. The wiring direction of the conductive medium 110 is not limited in the present invention. For example, the wiring direction of the conductive medium 110 may be from the photosensitive chip 20 to the circuit board 30, or the wiring direction of the conductive medium 110 may be from the circuit board 30 to the photosensitive chip 20. It is to be noted that the surface on which the photosensitive area of the photosensitive chip 20 is located is the upper surface of the photosensitive chip 20, and the surface of the photosensitive chip 20 opposite to the surface on which the photosensitive area of the photosensitive chip 20 is located is a lower surface of the photosensitive chip 20, that is, the photosensitive chip 20 has an upper surface, a lower surface, and a side surface, wherein the side surface is connected to the upper surface and the lower surface upward and downward, respectively, wherein the chip connector 21 may be disposed in the upper surface of the photosensitive chip 20. Nevertheless, it will be understood by those skilled in the art that the chip connector 21 can also be disposed in the lower surface or the side surface of the photosensitive chip 20.

In addition, the type of the conductive medium 110 is not limited in the camera module 1 of the present invention. For example, the conductive medium 110 may be any type of conductive medium that can be used to conduct the photosensitive chip 20 and the circuit board 30, such as gold, copper, silver, or the like.

It is to be noted that the shapes of the substrate connector 34 of the circuit board 30 and the shape of the chip connector 21 of the photosensitive chip 20 are not limited in the camera module 1 of the present invention. For example, the shapes of the substrate connector 34 of the circuit board 30 and the shape of the chip connector 21 of the photosensitive chip 20 may be a disk shape, a spherical shape, or the like.

Figure 8:
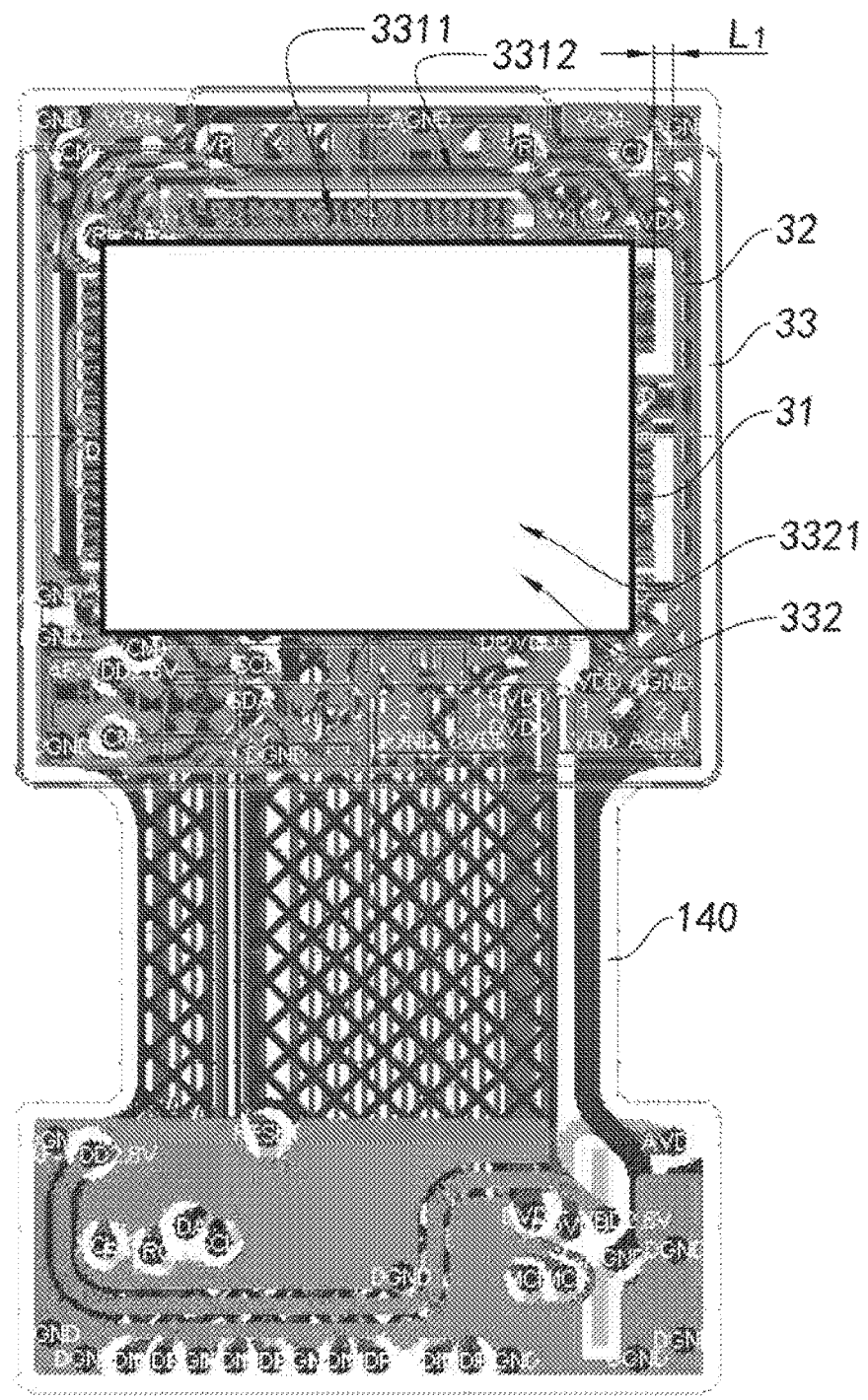
FIG. 8 is a top schematic view showing a variant embodiment of the circuit board of the camera module according to the above preferred embodiment of the present invention, illustrating the relationship among the digital circuit unit, the analog circuit unit and the substrate of the circuit board.
Figure 9:
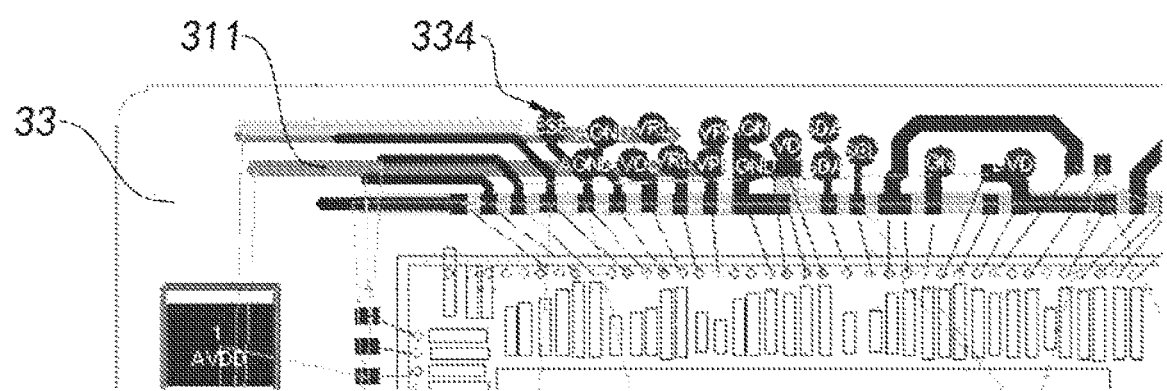
FIG. 9 is a partial schematic view of the circuit board of the camera module according to the above preferred embodiment of the present invention.
Figure 10:
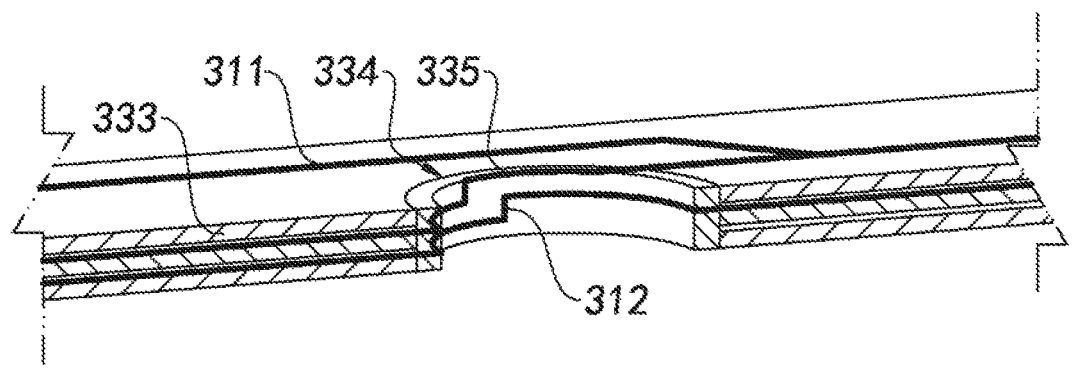
FIG. 10 is a schematic view of the circuit layout principle of the circuit board of the camera module according to the above preferred embodiment of the present invention.

FIG. 8 shows a variant embodiment of the circuit board 30 of the camera module 1 according to the present invention, wherein the chip holding portion 332 of the substrate 33 is implemented as a accommodating space 3321 for accommodating the photosensitive chip 20, such that the photosensitive chip 20 is held in the chip holding portion 332. Generally, the accommodating space 3321 of the substrate 33 is implemented as a groove, preferably a through hole, wherein after the photosensitive chip 20 is accommodated in the accommodating space 3321, and the photosensitive chip 20 and the circuit board 30 are conductively connected through the conductive medium 110, the circuit disposing portion 331 of the circuit board 30 and at least a part of the non-photosensitive area of the photosensitive chip 20 integrally forms the molded base 40, the photosensitive chip 20 is held in the accommodating space 3321 by the molding base 40, in this way, on one hand, the height of the camera module 1 can be reduced, and on the other hand, the flatness of the photosensitive chip 20 is no longer limited by the flatness of the circuit board 30, and is maintained by the molding base 40, thereby making the photosensitive chip 20 flatter, and the circuit board 30 can employ a thinner plate to further reduce the height of the camera module 1. In addition, the photosensitive chip 20 may be attached to the substrate 33 in a flip-chip process, and the photosensitive chip 20 and the circuit board 30 may be conductively connected.

In addition, the type of the substrate 33 is not limited in the camera module 1 of the present invention. For example, the substrate 33 may be, but not limited to, a soft board, a hard board, a ceramic board, and a soft and hard board.

Further, the substrate 33 has at least two plate layer 333, that is, two or more of the plate layers 333 overlap each other to form the substrate 33. The circuit of the digital circuit unit 31 and the circuit of the analog circuit unit 32 are respectively disposed on each of the plate layers 333 of the substrate 33. The parameter of the layer number of the plate layer 333 of the substrate 33 is Y, wherein the parameter Y has a value range of 2~20 (including 2 and 20). Preferably, the parameter Y has a value range of 3~15 (including 3 and 15). More preferably, the parameter Y has a value range of 4~10 (including 4 and 10). The thickness parameter of the plate layer 333 is Z, wherein the parameter Z has a value range of 0.005 mm~0.5 mm (including 0.005 mm and 0.5 mm) Preferably, the parameter Z has a value range of 0.01 mm~0.2 mm (including 0.01 mm and 0.2 mm) The substrate 33 has at least one communicating hole 334 and a circuit connector 335, wherein the communicating hole 334 communicates with each of the plate layers 333 of the substrate 33, and the circuit connector 335 is formed on the peripheral wall of the communicating hole 334 for conductively connecting to the circuit of the digital circuit unit 31 and the circuit of the analog circuit unit 32 disposed in each of the plate layers 333.

The circuit of the digital circuit unit 31 includes a horizontal extension circuit 311 and a vertical extension circuit 312, wherein the horizontal extension circuit 311 of the digital circuit unit 31 of the plate layer 333 disposed in the upper layer substantially extends horizontally, the vertical extension circuit 312 of the digital circuit unit 31 of the plate layer 333 disposed in the upper layer is electrically connected to the horizontal extension circuit 311 of the digital circuit unit 31 of the plate layer 333 disposed in the lower layer through the circuit connector 335. Correspondingly, the circuit of the analog circuit unit 32 also includes the horizontal extension circuit 311 and the vertical extension circuit 312, wherein the horizontal extension circuit 311 of the analog circuit unit 32 of the plate layer 333 disposed in the upper layer substantially extends horizontally, and the vertical extension circuit 312 of the analog circuit unit 32 of the plate layer 333 disposed in the upper layer is electrically connected to the horizontal extension circuit 311 of the analog circuit unit 32 of the plate layer 333 disposed the lower layer through the circuit connector 335. According to the above manner, the width of the substrate 33 can be sufficiently utilized to make the length and width of the substrate 33 smaller, thereby further reducing the volume of the camera module 1.

The diameter of the communicating hole 334 may be larger than the width of the circuit, or may be equal to or smaller than the diameter of the circuit. The diameter parameter of the communicating hole 334 is a, wherein the parameter a has a value range of 0.005 mm~0.8 mm (including 0.005 mm and 0.8 mm) Preferably, the parameter a has a value range of 0.1 mm~0.5 mm (including 0.1 mm and 0.5 mm) The minimum width parameter of the circuit is b, wherein the parameter b has a value range of 0.001 mm~0.5 mm (including 0.001 mm and 0.5 mm), preferably, the parameter b has a value range of 0.02 mm~0.1 mm (including 0.02 mm and 0.1 mm) The minimum distance parameter of the adjacent circuit or the communicating hole 334 is c, wherein the parameter c has a value range of 0.001 mm~0.5 mm (including 0.001 mm and 0.5 mm), preferably, the parameter c has a value range of 0.02 mm~0.1 mm (including 0.02 mm and 0.1 mm) The minimum distance parameter of the edge of the substrate 33 of the circuit board 30 and the edge of the analog circuit area 3312 is d, that is, the parameters of the manufacturing tolerance of the cutting tolerance superposition line are d. The width parameter of the narrowest side of the substrate 33 (i.e., the distance between the inner wall of the substrate 33 for forming the accommodating space 3321 and the outer wall of the substrate 33) is e, wherein the parameter e has a value range of: $[2*d+\min(a, b)*2+c] \sim [2*d+10*\max(a, b)+9*c]$ (including $[2*d+\min(a, b)*2+c]$ and $[2*d+10*\max(a, b)+9*c]$, preferably, the parameter e has a value range of: $[2*d+2*\max(a, b)+c] \sim [2*d+4*\max(a, b)+3*c]$ (including $[2*d+2*\max(a, b)+c]$ and $[2*d+4*\max(a, b)+3*c]$). The parameter of the distance of the photosensitive chip 20 and the accommodating space 3321 is h, wherein the parameter h has a value range of: 0.002 mm~5 mm (including 0.002 mm and 5 mm), preferably 0.02 mm~1 mm (including 0.02 mm and 1 mm).

The size of the circuit board 30 affects the size of the camera module 1. Specifically, the parameter of the length of the photosensitive chip 20 in a certain direction is f, and the parameter of the length of the camera module 1 in this direction is g, wherein the center of the photosensitive chip 20 is the origin, the shortest length from the origin to the sides of the substrate 33 in this direction is the shortest length of the camera module 1 in this direction, that is, $g=f+e+d+h$. By calculation, it can be obtained that, the parameter g has a value range of: $[f+3*d+\min(a, b)*2+c+h] \sim [f+3*d+10*\max(a, b)+9*c+h]$ (including $[f+3*d+\min(a, b)*2+c+h]$ and $[f+3*d+10*\max(a, b)+9*c+h]$). Preferably, the parameter g has a value range of: $[f+3*d+2*\max(a, b)+c+h] \sim [f+3*d+4*\max(a, b)+3*c+h]$ (including $[f+3*d+2*\max(a, b)+c+h]$ and $[f+3*d+4*\max(a, b)+3*c+h]$).

Further, referring to FIG. 4A, in this exemplary embodiment of the present invention, the camera module 1 further includes at least one protecting portion 120, wherein the protecting portion 120 has at least one opening 121, wherein the protecting portion 120 is formed on or disposed in the circuit disposing portion 331 of the substrate 33 of the circuit board 30, the chip holding portion 332 of the substrate 33, the electronic component 80 or the connector, which corresponds to the opening 121 of the protecting portion 120. When the molding base 40 is molded by the molding die 100, the protecting portion 120 can protect the circuit board 30, and can protect the photosensitive area of the photosensitive chip 20 from contamination. For example, the protecting portion 120 can prevent the circuit board 30 from rolling up being caused by shrinkage of the molding base 40 due to curing, in such a manner that it is being held between the molding base 40 and the circuit board 30, such that the circuit board 30 is protected. Further, the molding base 40 can embed a part of the protecting portion 120.

It is to be noted that the protecting portion 120 may also be formed on or disposed in at least a part of the non-photosensitive area of the photosensitive chip 20, such that the molding die 100 applies pressure to the non-photosensitive area of the photosensitive chip 20 in the molding process. In addition, the protecting portion 120 may be formed on or disposed in the circuit disposing portion 331 of the substrate 33 and at least a part of the non-photosensitive area of the photosensitive chip 20.

It is to be noted that, in other exemplary embodiment of the camera module 1, the protecting portion 120 may not have the opening 121, for example, before the photosensitive chip 20 is attached to the substrate 33, on the surface of the substrate 33, the protective portion 120 may be formed on the surface of the substrate 33 by using a material such as ink by applying any possible material, such as ink, or the like, to the surface of the substrate 33.

Further, the circuit disposing portion 331 of the substrate 33 further includes at least one bonding area 3313 and at least one protecting area 3314, wherein the protecting portion 120 is at least formed on or disposed in the protecting area 3314 of the circuit disposing portion 331 of the substrate 33. In one exemplary embodiment, a part of the protecting portion 120 may also be formed on or disposed in at least a part of the bonding area 3313 of the circuit disposing portion 331 of the substrate 33, or a part of the protecting portion 120 may also be formed on or disposed in at least a part of the non-photosensitive area of the photosensitive chip 20, or a part of the protecting portion 120 may be simultaneously formed on or disposed in at least a part of the non-photosensitive area of the photosensitive chip 20 and at least a part of the bonding area 3313, or a part of the protecting portion 120 may also be formed on or disposed in the chip holding portion 332. When a part of the protecting portion 120 is formed on or disposed in the bonding area 3313 and the molding base 40 is integrally bonded to the bonding area 3313 of the substrate 33, the molding base 40 may embed a part of the protecting portion 20.

In addition, the molding base 40 can separate the digital circuit unit 31 and the analog circuit unit 32 after molding, thereby further preventing electromagnetic wave interference generated by the circuit of the digital circuit unit 31 from interfering with the electrical signal transmitted and processed by the analog circuit unit 32. FIGS. 11 to 19 illustrate a manufacturing process of the camera module 1, wherein the molding base 40 is molded on the circuit board 30 by the molding die 100 while the camera module 1 being fabricated. The molding die 100 includes an upper die 101 and a lower die 102, wherein the upper die 101 has at least one base molding portion 1011 and at least one light window molding portion 1012 and has at least one molding guide groove 1013, wherein the light window molding portion 1012 is integrally formed on a middle part of the base molding portion 1011 to form the molding guide groove 1013 between the base molding portion 1011 and the light window molding portion 1012, wherein at least one of the upper die 101 and the lower die 102 can be operated such that the molding die 100 is subjected to a clamping and demolding operation to form at least one molding space 103 between the upper die 101 and the lower die 102, that is, the molding space 103 of the molding die 100 is formed at a position corresponding to the molding guide groove 1013 of the upper die 101. It can be understood that, when the molding die forms two or more of the molding spaces 103, the adjacent molding spaces 103 can be conductively connected to allow a molding material 200 to be added to one of the molding space 103, the molding material 200 can also be filled in the adjacent molding space 103.

Figure 12B:
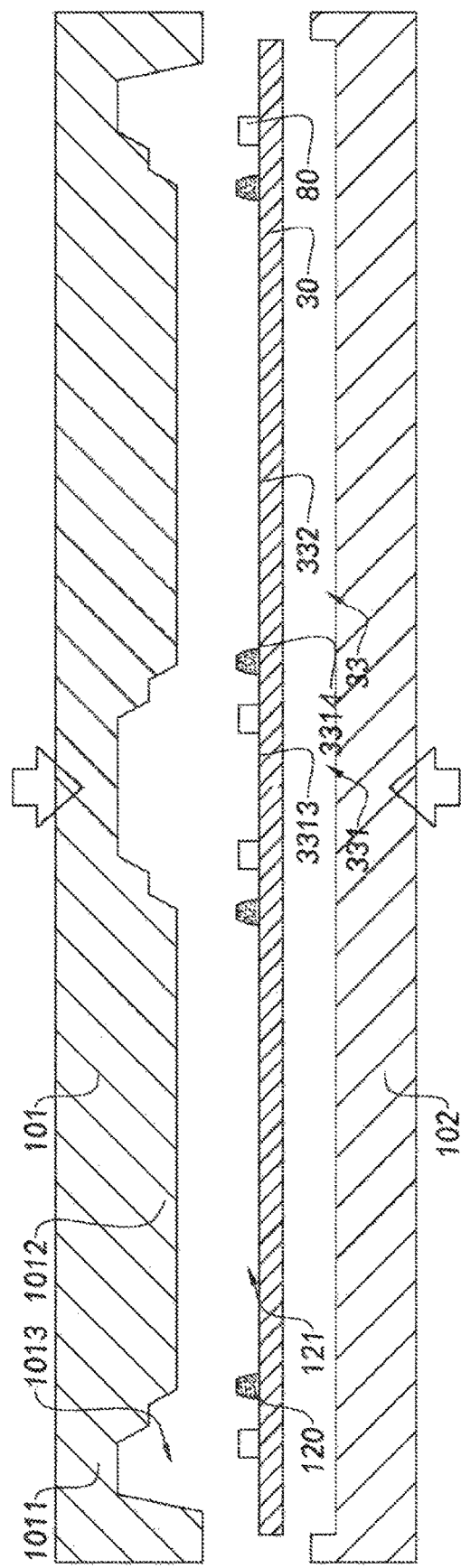
FIG. 12B is a schematic view showing a first optional variant step of the second manufacturing step of the camera module according to the above preferred embodiment of the present invention.

Referring to FIG. 11, the electronic component 80 is attached to the substrate 33 of the circuit board 30, such that the electronic component 80 is electrically connected to the circuit disposed on the substrate 33, thereby the circuit disposed in the digital circuit area 3311 of the circuit disposing portion 331 of the substrate 33 and the electronic component 80 attached to the digital circuit area 3311 form the digital circuit unit 31, the circuit disposed in the analog circuit area 3312 of the circuit disposing portion 331 of the substrate 33 and the electronic component 80 attached to the analog circuit area 3312 form the analog circuit unit 32. It can be understood that, although the electronic component 80 is attached to the upper surface of the substrate 33 in FIG. 11, in other exemplary embodiment, the electronic component 80 can be attached to the lower surface of the substrate 33, or attached to both the upper surface and the lower surface of the substrate 33. Nevertheless, those skilled in the art will be understood that the electronic component 80 may also be partially or fully embedded in the substrate 33. Referring to FIG. 12A and FIG. 12B, the protecting portion 120 is disposed in or formed on the protecting area 3314 of the circuit disposing portion 331 of the substrate 33. Preferably, the protecting portion 120 is formed at least in the protecting area 3314 of the substrate 33 in the drawing. For example, in this exemplary embodiment shown in FIG. 12A, a medium, such as ink, or the like may be applied to the protecting area 3314 of the substrate 33 to form the protecting portion 120 on the protecting area 3314 of the substrate 33 by a medium such as ink, or the like. Of course, the ink may also form the protecting portion 120 at the bonding area 3313 of the substrate 33 and/or at the chip holding portion 332 of the substrate 33. In the exemplary embodiment shown in FIG. 12B, the protecting portion 120 may be formed by a medium, such as glue, or the like applied to the protecting area 3314 of the substrate 33 after curing, it will be understood that, the opening 121 of the protecting portion 120 may also be formed while the protecting portion 120 is formed on the protecting portion 3314 by a medium, such as glue, or the like, wherein the opening 121 of the protecting portion 120 corresponds to the chip holding portion 332. In addition, the protecting portion 120 may also be formed on the bonding area 3313 of the substrate 33. It is to be noted that, in other exemplary embodiment, the photosensitive chip 20 may be first held in the chip holding portion 332, for example, the photosensitive chip 20 may be attached to the chip holding portion 332, or the photosensitive chip 20 is accommodated in the chip holding portion 332 that is implemented as the accommodating space 3321, and then the protecting portion 120 is formed on the non-photosensitive area of the photosensitive chip 20 and corresponds to the opening 121 of the photosensitive area of the photosensitive chip 20, or the protecting portion 120 is formed on the non-photosensitive area of the photosensitive chip 20 and the protecting area 3314 simultaneously and corresponds to the opening 121 of the photosensitive area of the photosensitive chip 20, alternatively, the protecting portion 120 is formed on the non-photosensitive area of the photosensitive chip 20, the protecting area 3314, and the bonding area 3313 simultaneously, and corresponds to the opening 121 of the photosensitive area of the photosensitive chip 20.

The width parameter of the protecting area 3314 of the substrate 33 is L2, wherein the parameter L2 has a value range of: 0.01 mm~10 mm (including 0.01 mm and 10 mm) Preferably, the parameter L2 has a value range of: 0.5 mm~5 mm (including 0.5 mm and 5 mm).

It can be understood that the protecting area 3314 is at least a partial area of the press-fitted surface 10121 of the light window molding block 1012 of the upper die 101 of the molding die 100, such that the width of the protecting portion 120 formed in the protecting area 3314 can be ensured by ensuring the width of the protecting area 3314, thereby the circuit board 30 can be protected by the protecting portion 120 in a molding process.

Figure 12C:
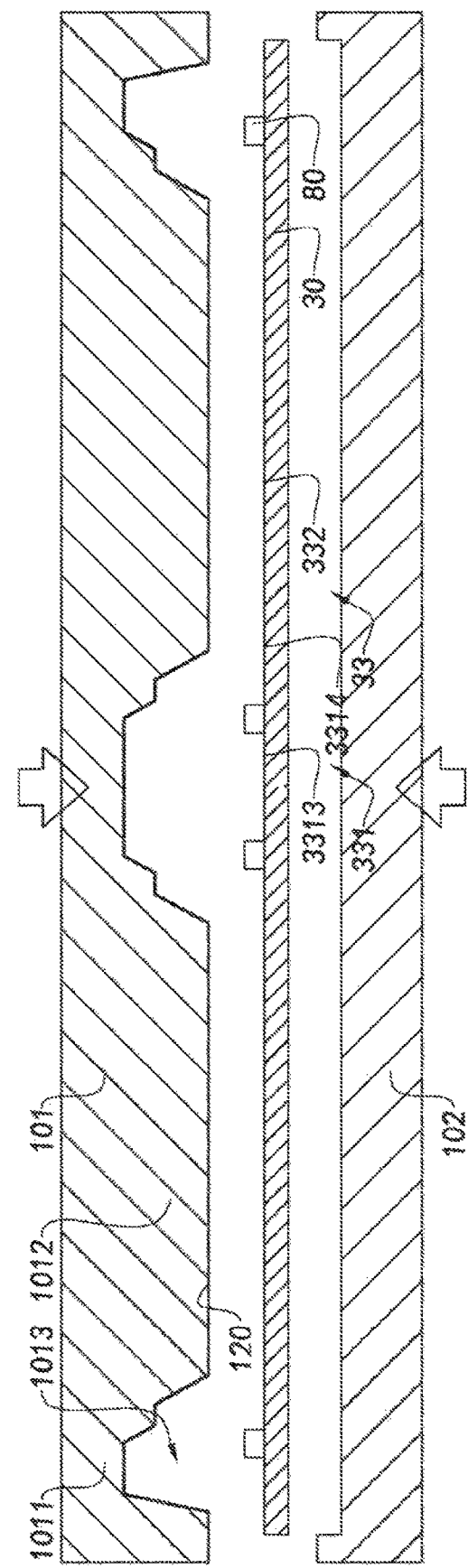
FIG. 12C is a schematic view showing a second optional variant step of the second manufacturing step of the camera module according to the above preferred embodiment of the present invention.
Figure 13:
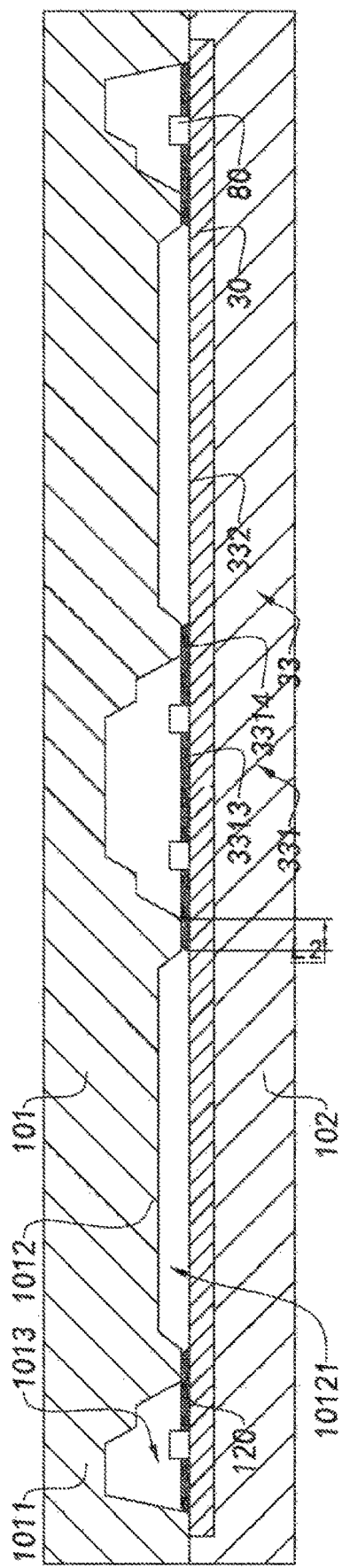
FIG. 13 is a schematic view of a third manufacturing step of the camera module according to the above preferred embodiment of the present invention.
Figure 14:
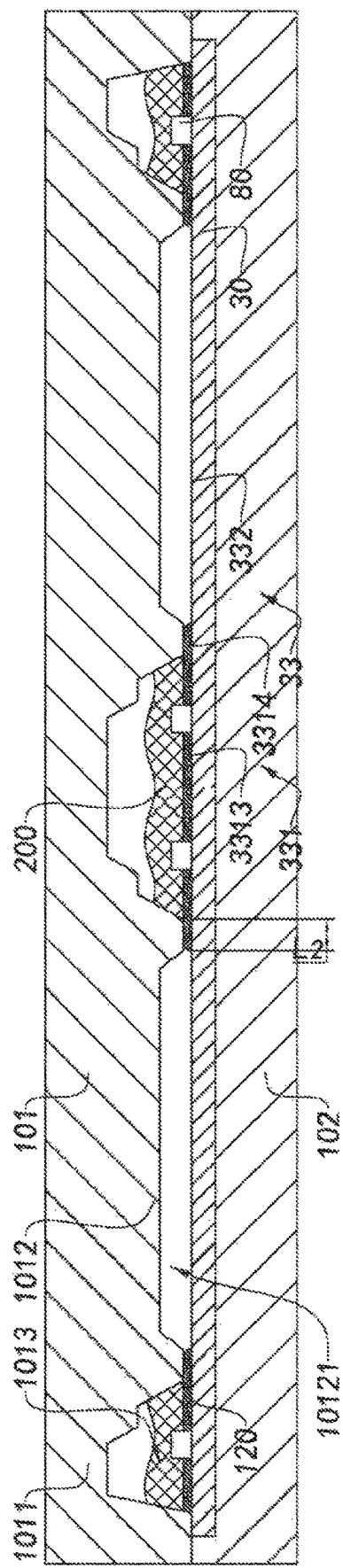
FIG. 14 is a schematic view of a fourth manufacturing step of the camera module according to the above preferred embodiment of the present invention.
Figure 17:
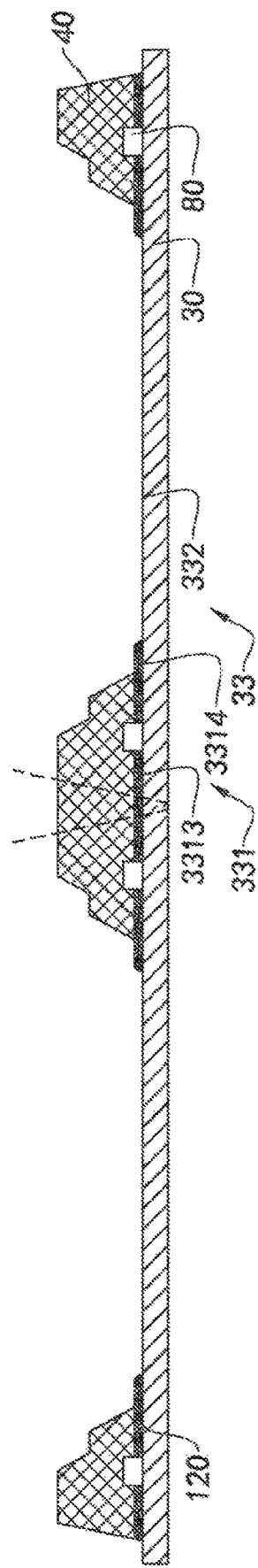
FIG. 17 is a schematic view of a seventh manufacturing step of the camera module according to the above preferred embodiment of the present invention.
Figure 18:
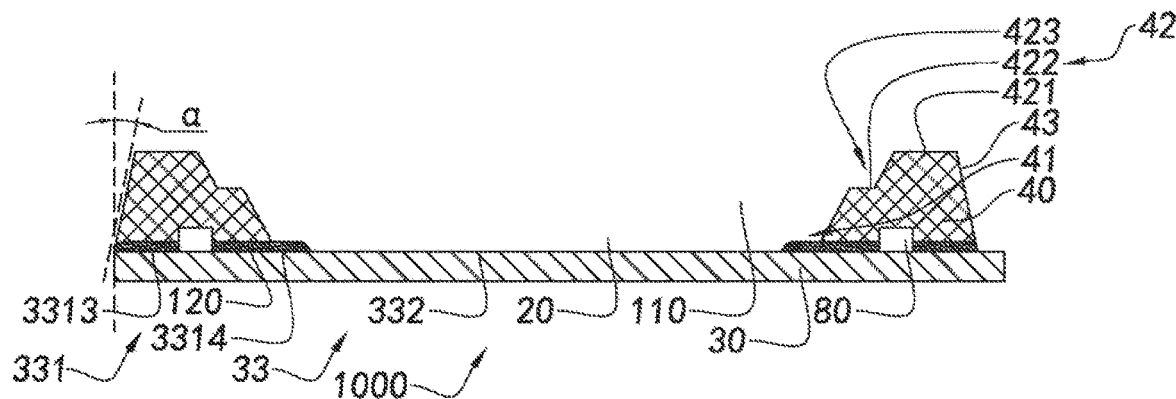
FIG. 18 is a schematic view of an eighth manufacturing step of the camera module according to the above preferred embodiment of the present invention.

FIG. 12C shows a variant embodiment, wherein the protecting portion 120 may not be formed on the circuit board 30, but the protecting portion 120 is formed on the press-fitted surface 10121 of the light window molding block 1012 of the upper mold 101 of the molding die 100, such that the protecting portion 120 can be located between the press-fitted surface 10121 of the light window molding block 1012 and the circuit board 30 in a molding process to protect the circuit board. It can be understood that, in this exemplary embodiment, the protecting portion 120 may not have the opening 121, for example, the protecting portion 120 can be implemented as a cover film that covers at least the light window molding block 1012 of the upper mold 101.

Nevertheless, it can be understood by those skilled in the art that the protecting portion 120 can also be formed on the photosensitive chip 20, for example, the chip surface protective glue of the photosensitive chip 20 can form the protecting portion 120, such that in the molding process, the press-fitted surface 10121 of the upper die 101 of the molding die 100 applies pressure to the photosensitive chip 20, such that the protecting portion 120 is located between the press-fitted surface 10121 and the photosensitive chip 20 to protect the photosensitive chip 20. In addition, the protecting portion 120 may also be formed on the filter element 60, such that in a molding process, the press-fitted surface 10121 of the upper die 101 of the molding die 100 applies pressure to the filter element 60, such that the protecting portion 120 is located between the press-fitted surface 10121 and the filter element 60 to protect the filter element 60.

In the following description, the features and advantages of the camera module 1 of the present invention are further explained by taking the protecting portion 120 formed on the bonding area 3313 and the protecting area 3314 of the substrate 33 as an example. The press-fitted surface 10121 of the upper die 101 applies pressure to the protecting area 3314 when the molding die 100 is operated to be clamped, wherein the bonding area 3313 is located in the molding space 103 of the molding die 100.

The protecting portion 120 is located between the press-fitted surface 10121 of the upper die 101 and the circuit board 30, such that the protecting portion 120 can prevent the press-fitted surface 10121 of the upper die 101 from directly pressing on the circuit board 30. Preferably, the protecting portion 120 has sufficient elasticity, in this way, on one hand, the protecting portion 120 can absorb the impact force generated by the molding die 100 when being clamped, to prevent the circuit board 30 from the damage and deformation caused by the impact force, on the other hand, the protecting portion 120 can prevent a gap from being formed between the press-fitted surface 10121 of the upper die 101 and the circuit board 30, thereby in the subsequent molding process, the molding material 200 is prevented from entering the protecting area 3314 from the bonding area 3313. The width of the protecting area 3314 of the substrate 33 is a value range of the parameter L2, such that the press-fitted surface 10121 of the upper die 101 and the protecting portion 120 can be completely contacted to ensure the reliability of the molding process. It is to be noted that, the protecting portion 120 has sufficient strength to ensure that, when applying pressure to the protection portion 120, the shape of the press-fitted surface 10121 of the upper die 101 after completing the molding process is not affected by the deformation of the protecting portion 120 due to its excessive deformation.

The molding material 200 in the fluid state is added to the molding space 103 of the molding die 100, and the molding material 200 is filled in the molding space 103, such that the molding base 40 is obtained after the molding material 200 is cured in the molding space 103. Since the protecting portion 120 prevents a gap from being formed between the press-fitted surface 10121 of the upper die 101 and the circuit board 30, the molding material 200 does not overflow to prevent the molding material 200 from occurring an undesirable phenomenon of "flash" caused by its leaking. It is to be noted that the molding material 200 may be a liquid material, or may be a solid particle, or a mixture of a liquid material and solid particles, such that the molding material 200 can flow, in order to enable the molding material 200 added to the molding space 103 to fill the molding space 103.

In addition, although the protecting portion 120 is formed on the protecting area 3314 of the circuit board 30, the inner surface of the upper die 101 may also form the protecting portion 120, such as a cover film, to facilitate demolding of the molded base 40 after molding. It can be understood that the inner surface of the upper die 101 includes the press-fitted surface 10121 and the inner surface of the upper die 101 for forming the molding guide groove 1013.

Generally, a plurality of the circuit boards 30 may form a jointed circuit board, and then the jointed circuit board is subjected to a molding process. At this time, after the demolding, the jointed circuit board molded with the molding base 40 needs to be divided for example, by cutting or etching to obtain the molding circuit board assembly 1000.

Figure 19:
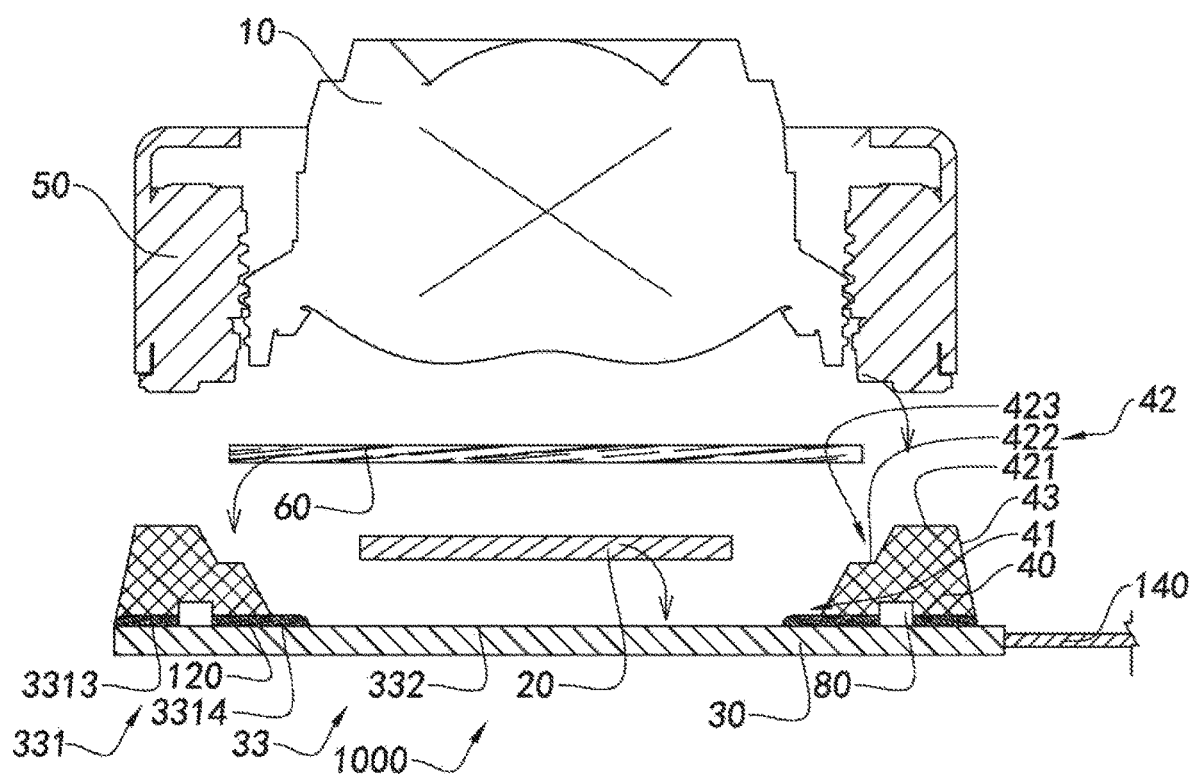
FIG. 19 is a schematic view of a ninth manufacturing step of the camera module according to the above preferred embodiment of the present invention.

Referring to FIG. 19, the photosensitive chip 20 is attached to the chip holding portion 332 of the substrate 33 through the light window 41 of the molding base 40, and both ends of the conductive medium 110 are electrically connected to the substrate connector 34 and the chip connector 21 of the photosensitive chip 20 by a wiring process respectively, to conductively connect the photosensitive chip 20 and the circuit board 30. The filter element 40 is attached to the inner side surface 422 of the top surface 42 of the molding base 40. The optical lens 10 is assembled to the driver 50, and the driver 50 is assembled to the outer surface 421 of the top surface 42 of the molding base 40, such that the optical lens 10 is held in the photosensitive path of the photosensitive chip 20 to obtain the camera module 1.

According to another aspect of the present invention, the present invention further provides a method of manufacturing a molding circuit board assembly 1000, wherein the manufacturing method comprises the following steps:

(a) providing a substrate 33 with a protecting portion 120, wherein the protecting portion 120 is located at least in a protecting area 3314 of the substrate 33;

(b) forming a molding base 40 having at least one light window 41 on a bonding area 3313 of the substrate 33 by a molding process; and (c) conductively connecting a photosensitive chip 20 to the substrate 33 via the light window 41 of the molding base 40 to manufacture the molding circuit board assembly 1000.

According to another aspect of the present invention, the present invention further provides a method of manufacturing a camera module 1, wherein the manufacturing method comprises the following steps:

(A) providing a substrate 33 with a protecting portion 120, wherein the protecting portion 120 is located at least in a protecting area 3314 of the substrate 33;

(B) forming a molding base 40 having at least one light window 41 on a bonding area 3313 of the substrate 33 by a molding process;

(C) conductively connecting a photosensitive chip 20 to the substrate 33 via the light window 41 of the molding base 40; and (D) holding an optical lens 10 on an photosensitive path of the photosensitive chip 20 to manufacture the camera module 1.

It will be understood by those skilled in the art that the embodiments of the invention illustrated in the drawings and described above are merely illustrative and not limiting. It can be seen that the object of the invention can be fully and efficiently accomplished. This embodiment for explaining the functional and structural principles of the present invention has been fully illustrated and described, and the present invention is not limited by the changes based on the principles of these embodiments. Accordingly, the present invention includes all modifications that fall within the scope and spirit of the appended claims.

The invention claimed is:

1. A circuit board, comprising:
a digital circuit unit;
an analog circuit unit; and
a substrate,
wherein the digital circuit unit and the analog circuit unit are respectively formed on different areas of the substrate, and the digital circuit unit and the analog circuit unit are conductively connected to each other,
wherein at least one part of the analog circuit unit has a safety distance from the digital circuit unit, and a parameter L1 of a width of the safety distance formed between the at least one part of the analog circuit unit and the digital circuit unit has a value range of: $0.02 \text{ mm} \leq L1 \leq 0.5 \text{ mm}$, so as to prevent electromagnetic waves generated by circuits of the digital circuit unit from interfering with electrical signals processed and transmitted by the analog circuit unit.

2. The circuit board according to claim 1, wherein 40%~100% of part of the analog circuit unit has the safety distance from the digital circuit unit.

3. The circuit board according to claim 2, wherein 70%~99% of part of the analog circuit unit has the safety distance from the digital circuit unit.

4. The circuit board according to claim 1, wherein the parameter L1 of the width of the safety distance has a value range of: $0.1 \text{ mm} \leq L1 \leq 0.4 \text{ mm}$.

5. The circuit board according to claim 1, wherein the shape of the analog circuit unit is selected from the group consisting of an L shape, a C shape, and an unclosed O shape.

6. The circuit board according to claim 5, wherein the substrate has at least one accommodation space for accommodating a photosensitive chip.

7. The circuit board according to claim 1, wherein the substrate comprises two or more plate layers that overlap each other.

8. The circuit board according to claim 7, wherein a layer number of the plate layers of the substrate has a value range of: 2~20.

9. The circuit board according to claim 8, wherein the layer number of the plate layers of the substrate has a value range of: 4~10.

10. The circuit board according to claim 7, wherein the substrate has at least one communicating hole and includes at least one circuit connector, wherein each of the communicating holes of the substrate communicates with two adjacent plate layers, each of the circuit connectors is formed on an inner wall of the substrate, which is used to form the communicating hole, and each of the circuit connectors conductively connects the circuits of two adjacent plate layers.

11. The circuit board according to claim 10, wherein the circuit on each of the plate layers is respectively a horizontally extending circuit and a vertically extending circuit, the horizontally extending circuit extends along a length direction and/or a width direction of the plate layer, the vertically extending circuit extends along a vertical direction of the plate layer, wherein the vertically extending circuit of one of the plate layers are conductively connected with horizontally extending circuit of adjacent plate layer by the circuit connector.

12. The circuit board according to claim 10, wherein the diameter parameter of the communicating hole is a, the width parameter of the circuit is b, the minimum distance parameter of adjacent circuits or adjacent communicating holes is c, the minimum distance parameter from the edge of the substrate to the edge of the analog circuit area is d, and the narrowest side width parameter of the substrate is e, wherein the parameter e has a value range of: [2*d+min(a, b)*2+c]~[2*d+10*max(a, b)+9*c].

13. The circuit board according to claim 12, wherein the parameter e has a value range of: [2*d+2*max(a, b)+c]~[2*d+4*max(a, b)+3*c].

14. The circuit board according to claim 7, wherein a thickness of the plate layer of the substrate has a value range of: 0.005 mm~0.5 mm.

15. The circuit board according to claim 14, wherein the thickness of the plate layer of the substrate has a value range of: 0.01 mm~0.2 mm.

16. A molding circuit board assembly, comprising:
at least one photosensitive chip;
a molding base, wherein the molding base has at least one light window; and
the circuit board according to claim 1,
wherein the photosensitive chip is held in a chip holding portion of the circuit board, and the photosensitive chip is conductively connected to at least one chip unit of the analog chip unit and the digital circuit unit of the circuit board,
wherein the molding base is integrally bonded to the substrate, and a photosensitive area of the photosensitive chip corresponds to the light window of the molding base.

17. The molding circuit board assembly of claim 16, further comprising a protecting portion,
wherein the circuit board further comprises at least one protecting area surrounding the chip holding portion, and at least one bonding area surrounding the protecting area,
wherein the protecting portion is located at least in the protecting area of the substrate,
wherein the molding base is integrally bonded to the bonding area of the substrate, and the molding base surrounds the photosensitive area of the photosensitive chip such that the photosensitive area of the photosensitive chip corresponds to the light window of the molding base.

18. A camera module, comprising:
at least one optical lens;
at least one photosensitive chip; and
at least one circuit board according to claim 1,
wherein the photosensitive chip is held in a chip holding portion of the circuit board, and the photosensitive chip is conductively connected to at least one chip unit of the analog circuit unit and the digital circuit unit of the circuit board, the optical lens is held in the photosensitive path of the photosensitive chip.

19. An electronic device, comprising:
an electronic device body; and
at least one camera module according to claim 18,
wherein the camera module is disposed in the electronic device body.

* * * * *